(12) United States Patent
Tanizaki et al.

(10) Patent No.: US 6,288,573 B1
(45) Date of Patent: *Sep. 11, 2001

(54) SEMICONDUCTOR DEVICE CAPABLE OF OPERATING FAST WITH A LOW VOLTAGE AND REDUCING POWER CONSUMPTION DURING STANDBY

(75) Inventors: Hiroaki Tanizaki; Masatoshi Ishikawa, both of Hyogo (JP)

(73) Assignees: Mitsubishi Denki Kabushiki Kaisha; Mitsubishi Electric Engineering Company Limited, both of Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/299,665

(22) Filed: Apr. 27, 1999

(30) Foreign Application Priority Data

Apr. 28, 1998 (JP) .................................................. 10-119238

(51) Int. Cl.$^7$ ................................................ H03K 19/094
(52) U.S. Cl. ........................... 326/120; 326/119; 326/121
(58) Field of Search .................................... 326/120, 112, 326/119, 121

(56) References Cited

U.S. PATENT DOCUMENTS 5,583,457 * 12/1996 Horiguchi et al. .................... 326/121
5,726,946 * 3/1998 Yamagata et al. .................... 365/226
5,973,533 * 10/1999 Nagaoka .............................. 327/263

FOREIGN PATENT DOCUMENTS 5-291929   11/1993   (JP) .
6-237164   8/1994    (JP) .
7-38417    2/1995    (JP) .

* cited by examiner

Primary Examiner—Michael Tokar
Assistant Examiner—Anh Tran
(74) Attorney, Agent, or Firm—McDermott, Will & Emery

(57) ABSTRACT

A transistor and a Pch circuit are connected in parallel to a power supply node of a CMOS circuit for receiving a power supply potential therefore. A transistor and an Nch circuit are connected in parallel to a ground node of the CMOS circuit for receiving a ground potential. During operation, the transistors are on, and the CMOS circuit operates fast. During standby, the Nch circuit or the Pch circuit is off in accordance with the state immediately before the standby. The Nch and Pch circuits are formed of transistors having larger threshold voltages than that of transistors of the CMOS circuit, so that a sub-threshold current during standby can be reduced.

15 Claims, 18 Drawing Sheets

| | SC | ZSC | IN | OUT |
|---|---|---|---|---|
| OPERATING | H | L | H | L |
| | H | L | L | H |
| STANDBY | L | H | H | L |
| | L | H | L | H |

INVERTER

FIG. 9

|  | SC | ZSC | A | B | Y |
|---|---|---|---|---|---|
| OPERATION | H | L | L | L | H |
|  | H | L | L | H | H |
|  | H | L | H | L | H |
|  | H | L | H | H | L |
| STANDBY | L | H | L | L | H |
|  | L | H | L | H | H |
|  | L | H | H | L | H |
|  | L | H | H | H | L |

NAND

FIG. 11

|  | SC | ZSC | A | B | Y |
|---|---|---|---|---|---|
| OPERATION | H | L | L | L | H |
|  | H | L | L | H | L |
|  | H | L | H | L | L |
|  | H | L | H | H | L |
| STANDBY | L | H | L | L | H |
|  | L | H | L | H | L |
|  | L | H | H | L | L |
|  | L | H | H | H | L |

NOR

FIG. 13

| | SC | ZSC | ZC | C | A | Y |
|---|---|---|---|---|---|---|
| OPERATING | H | L | L | H | L | H |
| | H | L | L | H | H | L |
| | H | L | H | L | L | HiZ |
| | H | L | H | L | H | HiZ |
| STANDBY | L | H | L | H | L | H |
| | L | H | L | H | H | L |
| | L | H | H | L | L | HiZ |
| | L | H | H | L | H | HiZ |

CLOCKED INVERTER (1)

FIG. 15

| | SC | ZSC | ZC | C | A | Y |
|---|---|---|---|---|---|---|
| OPERATING | H | L | L | H | L | H |
| | H | L | L | H | H | L |
| | H | L | H | L | L | HiZ |
| | H | L | H | L | H | HiZ |
| STANDBY | L | H | L | H | L | H |
| | L | H | L | H | H | L |
| | L | H | H | L | L | HiZ |
| | L | H | H | L | H | HiZ |

CLOCKED INVERTER (2)

FIG. 17

| | SC | ZSC | Set | Reset | Q | QC |
|---|---|---|---|---|---|---|
| OPERATING | H | L | H | H | HOLD | HOLD |
| | H | L | L | H | H | L |
| | H | L | H | L | L | H |
| | H | L | L | L | UNSTABLE | UNSTABLE |
| STANDBY | L | H | H | H | HOLD | HOLD |

NAND RS LATCH

FIG. 19

| | SC | ZSC | Set | Reset | Q | QC |
|---|---|---|---|---|---|---|
| OPERATING | H | L | L | L | HOLD | HOLD |
| | H | L | H | L | L | H |
| | H | L | L | H | H | L |
| | H | L | H | H | UNSTABLE | UNSTABLE |
| STANDBY | L | H | L | L | HOLD | HOLD |

NOR RS LATCH

HIGH-Vt TRANSISTOR

LOW-Vt TRANSISTOR

SEMICONDUCTOR DEVICE CAPABLE OF OPERATING FAST WITH A LOW VOLTAGE AND REDUCING POWER CONSUMPTION DURING STANDBY

BACKGROUND OF THE INVENTION

1. Field of the Invention

The present invention relates to a semiconductor device, and particularly a semiconductor device including a CMOS circuit.

2. Description of the Background Art

As a result of miniaturization of transistors, breakdown voltages of the transistors decrease, and therefore operation voltages must be necessarily lowered. In addition, portables must operate with a low voltage and a low power because portables are generally configured to operate on batteries.

In general, the operation speed lowers if the operation voltage is lowered. Therefore, it is necessary to lower threshold voltages of MOS transistors for achieving the low-voltage operation without impairing the operation speed. However, if the threshold voltage were excessively lowered, the transistor could not be cut off sufficiently, and an unignorable sub-threshold current would flow even during the off state of the transistor. This would impair low-voltage characteristics which are the most distinctive feature of conventional CMOS circuit.

FIG. 20 is a circuit diagram showing a structure of an inverter 500 in a conventional semiconductor device.

Referring to FIG. 20, inverter 500 includes a P-channel MOS transistor 501 which receives on its gate an input signal IN, and has a source coupled to a power supply potential Vdd, and an N-channel MOS transistor 502 which receives input signal IN on its gate, and has a source coupled to a ground potential Vss and a drain coupled to the drain of P-channel MOS transistor 501.

The potential on the drain of N-channel MOS transistor 502 provides an output signal OUT. The operation speed of the transistor is inversely proportional to (Vdd−Vt) where Vt represents a threshold voltage of N-channel MOS transistor 502. For suppressing reduction in speed, therefore, it is necessary to lower threshold voltage Vt in accordance with lowering of power supply potential Vdd.

However, excessively low threshold voltage Vt results in such a situation that an unignorable sub-threshold current IL flows through N-channel MOS transistor 502 even when a potential of 0 volts is applied as input signal IN.

FIG. 21 shows a relationship between a gate-source voltage VGS and a drain current IDS of the N-channel MOS transistor.

Particularly, FIG. 21 shows a change in drain current which occurs when gate-source voltage VGS changes at and around threshold voltage Vt, and the ordinate gives the drain current on a logarithmic scale.

On a graph or curve 504 in FIG. 21, it is assumed that the gate-source voltage is equal to threshold voltage Vt when a constant current IO flows through the transistor. Description is now be given on the case where an N-channel MOS transistor having a threshold voltage Vt2 lower than threshold voltage Vt is used for allowing use with a lower power supply voltage. A graph or curve 506 represents a relationship between the drain current and the gate-source voltage of the above N-channel MOS transistor. From comparison between the values which the drain current takes on graphs 504 and 506 when gate-source voltage VGS is 0 volts, drain current IDS on graph 506 is IL2 which is higher than IL on graph 504. Accordingly, in the structures which have higher integration densities and operate with lower power supply voltages and lower operation voltages, the sub-threshold current cannot be ignored, and increase in standby current results in a critical problem in battery-powered portables.

FIG. 22 is a circuit diagram showing an inverter 510, which can reduce a sub-threshold current by switching the source voltage, as is already proposed.

Referring to FIG. 22, inverter 510 includes an inverter 511 which has a power supply node coupled to power supply potential Vdd and a ground node connected to a node N100 for receiving input signal IN and issuing output signal OUT, and an N-channel MOS transistor 516 which receives on its gate a control signal SC, and has a drain connected to node N100 and a source connected to ground potential Vss.

Inverter 511 includes a P-channel MOS transistor 512 which receives input signal IN on its gate, and has a source connected to the power supply node and a drain connected to the output node, and an N-channel MOS transistor 514 which receives input signal IN on its gate, and has a source connected to node N100 and a drain connected to the output node.

FIGS. 23A and 23B show different types of transistors. FIG. 23A shows a symbol of a high-Vt transistor having a high threshold voltage Vt, and FIG. 23B shows a symbol of a low-Vt transistor having a low threshold voltage.

In the specification and drawings, the symbol of a transistor 518 shown in FIG. 23A represents a transistor of a high threshold voltage, and the symbol of a transistor 520 shown in FIG. 23B represents a transistor of a low threshold voltage.

Referring to FIG. 22 again, this circuit performs the normal operation in such a manner that control signal SC turns on N-channel MOS transistor 516, and a potential VN on node N100 is set to the ground potential so that inverter 511 performs a normal logical operation.

When the potential applied as input signal IN is at a L-level (low level), P-channel MOS transistor 512 is turned on, and N-channel MOS transistor 514 is turned off so that the output potential of output signal OUT attains a H-level (high level). In this case, a sub-threshold current flows through N-channel MOS transistor 514 in the off state, and the sub-threshold current causes a current flow from the power supply node supplied with power supply potential Vdd to the ground node supplied with ground potential Vss.

When input signal IN is at H-level, P-channel MOS transistor 512 is off, and N-channel MOS transistor 514 is on so that output signal OUT is at L-level. In this case, a sub-threshold current flows through P-channel MOS transistor 512 in the off state, and a sub-threshold current flows from the power supply node to the ground node. As described above, power consumption due to the sub-threshold current is inevitable in the normal operation.

However, the above circuit can reduce the power consumption due to the sub-threshold current while it can be determined in advance that the input logic is fixed and, for example, while the chip is on standby.

Assuming that the circuit is on standby when input signal IN is at L-level, P-channel MOS transistor 512 is on, and N-channel MOS transistor 514 is off. In this state, output signal OUT is at H-level.

When control signal SC is switched from H-level to L-level for switching the control from the operating state to the standby state, N-channel MOS transistor 516 is turned off. Since the threshold voltage of N-channel MOS transistor 516 is larger in absolute value than that of N-channel MOS transistor 514, the sub-threshold current caused by N-channel MOS transistor 516 is almost negligible compared with the sub-threshold current flowing through N-channel MOS transistor 514.

Accordingly, the current flowing from the power supply node to the ground node depends on the sub-threshold current of N-channel MOS transistor 516 so that the power consumption due to the sub-threshold current during standby can be reduced.

Even if N-channel MOS transistor 516 has a high threshold voltage, this does not affect the operation speed of inverter 511 when N-channel MOS transistor 516 is on. A high speed is not required in switching from the operating speed to the standby state, compared with the operation speed of inverter 511. Therefore, the high threshold voltage and low (but not excessively low) operation speed of N-channel MOS transistor 516 do not cause a problem.

As described above, when input signal IN is at L-level, control signal SC can be appropriately determined to set the circuit in the standby state while statically holding the output potential of output signal OUT. Conversely, when input signal IN is at H-level, P-channel MOS transistor having a high threshold voltage is arranged on the power supply node side of inverter 511, whereby a similar effect can be achieved.

FIG. 24 is a circuit diagram showing a structure of a circuit 530 which employs inverters connected in series and each having the structure shown in FIG. 22.

Referring to FIG. 24, circuit 530 includes an inverter 536 which receives and inverts input signal IN, and issues the same to a node N106, an inverter 538 which receives and inverts the potential on node N106, and issues the same to a node N108, an inverter 540 which receives and inverts the potential on node N108, and issues the same to a node N110, and an inverter 542 which receives and inverts the potential on node N110, and issues output signal OUT. This circuit also includes a P-channel MOS transistor 532 which receives a control signal ZSC on its gate, and has a source coupled to power supply potential Vdd and a drain connected to a node N102, and an N-channel MOS transistor 534 which receives control signal SC on its gate, and has a source coupled to ground potential Vss and a drain connected to a node N104.

Power supply nodes of inverters 536 and 540 are connected to power supply potential Vdd. Power supply nodes of inverters 538 and 542 are connected to node N102. Ground nodes of inverters 536 and 540 are connected to node N104. Ground nodes of inverters 538 and 542 are coupled to ground potential Vss.

P-channel MOS transistor 532 has a threshold voltage larger in absolute value than those of P-channel MOS transistors included in inverters 536–542. N-channel MOS transistor 534 has a threshold voltage larger in absolute value than those of N-channel MOS transistors included in inverters 536–542.

Structures of inverters 536–542 are similar to that of inverter 510 shown in FIG. 22, and therefore description will not be repeated.

An operation of circuit 530 is described below.

In the normal operation, control signal ZSC at L-level is applied to circuit 530, and potential VP on node N102 becomes equal to power supply potential Vdd. Control signal SC applied to circuit 530 is at H-level, and potential VN on node N104 is at the ground potential. In this state, input signal IN is appropriately switched between H- and L-levels for performing logical operations.

During standby, control signal ZSC is set to H-level so that node N102 is isolated from the power supply node. Control signal SC is set to L-level so that node N104 is isolated from the ground node. When input signal IN is at L-level, the control described above is performed so that the potentials on nodes N106 and N110 are held at power supply potential Vdd, and node N108 and output signal OUT are held at ground potential Vss.

As described above, the sub-threshold current can be reduced. For this purpose, however, it is necessary to provide the P-channel MOS transistor of a high threshold voltage on the power supply node side of the inverter or the N-channel MOS transistor of a high threshold voltage on the ground node side depending on the logical value which is held during standby of the circuit.

In the prior art, the circuit structure must be determined in accordance with the standby state of the circuit, as is done in circuit 530 shown in FIG. 24. However, this circuit structure suffers from such a problem that the logical value held on the node, to which the signal is transmitted during standby, cannot be held statically if the logical value is not uniquely determined. Assuming that circuit 530 is on standby when input signal IN is at H-level, node N106 is in the high impedance state, and the potential on node N106 will become unstable with time.

When designing the circuit, consideration must be given to the standby state, and designing steps are disadvantageously required for arranging a transistor of a high threshold voltage on either the power supply node side or the ground node side for reducing the sub-threshold current.

SUMMARY OF THE INVENTION

An object of the invention is to provide a semiconductor device, in which a sub-threshold current can be reduced without giving consideration to a logical value held on a signal transmission node during standby.

In summary, the invention provides a semiconductor device including a first power supply node, a second power supply node and a first logic circuit.

The first power supply node receives a first power supply potential. The second power supply node receives a second power supply potential lower than the first power supply potential. The first logic circuit is connected to the first and second power supply nodes, operates in an operation mode to receive at least one signal and issue a result of a predetermined first logical operation to a first output node, and operates in a standby mode to hold the result of the first logical operation existing at the time of transition from the operation mode to the standby mode.

The first logic circuit includes a first logical operation unit arranged between first and second internal nodes, and issuing the result of the first logical operation in accordance with the signal.

The first logical operation unit includes a first internal circuit for connecting the first internal node to the first output node in accordance with the signal, and a second internal circuit for connecting the second internal node to the first output node in accordance with the signal.

The first logic circuit further includes a first connection circuit for connecting the first internal node to the first power supply node during the operation mode and when the first internal circuit connects the first internal node to the first output node, and a second connection circuit for connecting the second internal node to the second power supply node during the operation mode and when the second internal circuit connects the second internal node to the first output node.

A value of a leak current of the first connection circuit in the disconnected state is smaller than a value of a leak current of the first internal circuit in the disconnected state, and a value of a leak current of the second connection circuit in the disconnected state is smaller than a value of a leak current of the second internal circuit in the disconnected state.

Accordingly, a major advantage of the invention is as follows. In both the case where the output value of the output node is at H-level and the case where the output value thereof is at L-level, the circuit can change from the operating state to the standby state while holding the output value, and a sub-threshold current can be reduced during the standby state. Further, when returning from the standby state to the operating state, processing can be resumed using the output value of the output node which has been held. Therefore, the operation can be rapidly resumed without performing initial setting afresh.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 shows a relationship between input and output signals of circuit 210;

FIG. 11 shows a relationship between input and output signals of circuit 250;

FIG. 13 shows a relationship between input and output signals of circuit 290;

FIG. 15 shows a relationship between input and output signals of circuit 321;

FIG. 17 shows a relationship between input and output signals of circuit 340;

FIG. 19 shows a relationship between input and output signals of circuit 370;

DESCRIPTION OF THE PREFERRED EMBODIMENTS

Figure 1:
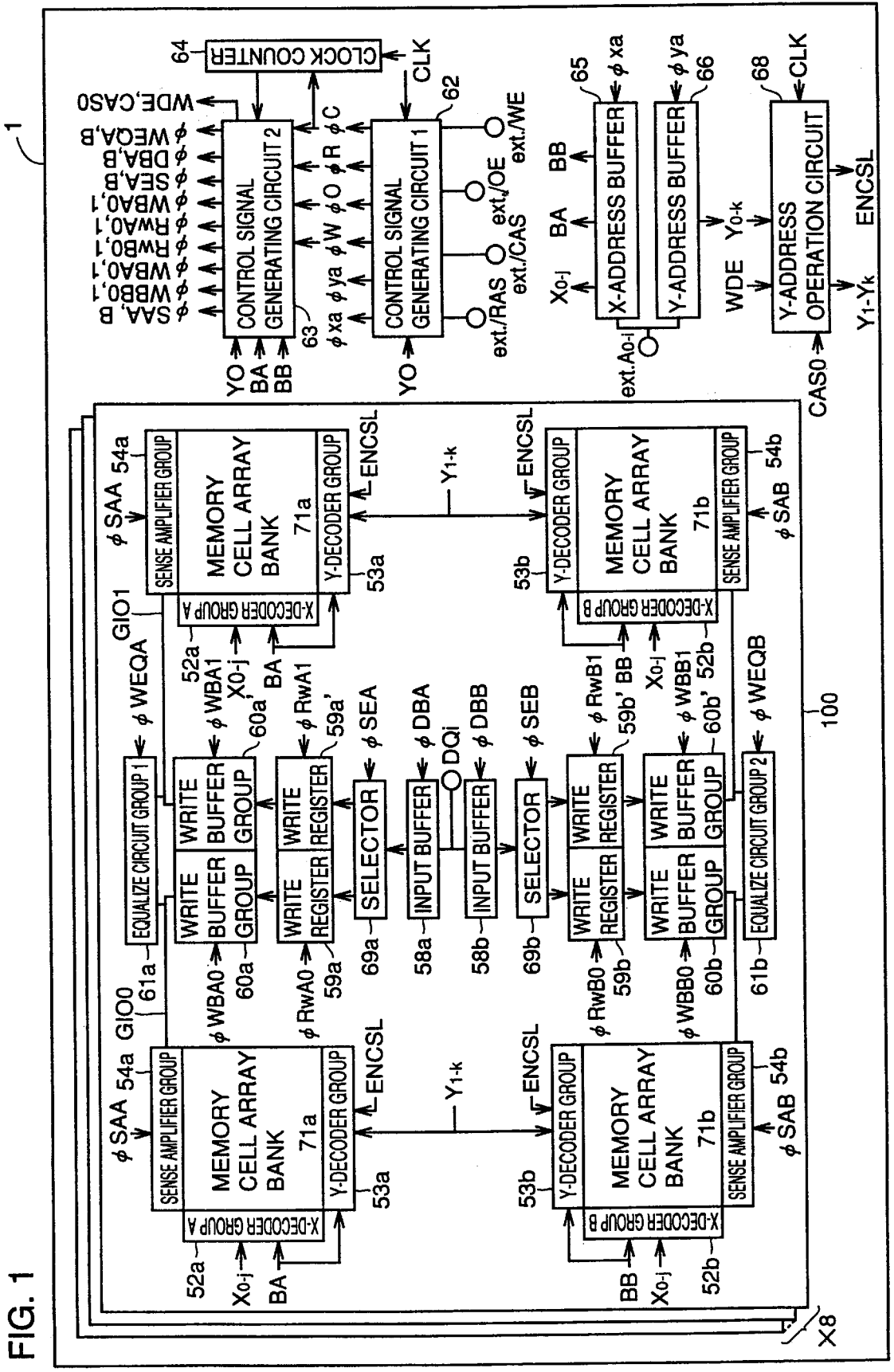
FIG. 1 is a schematic block diagram showing a structure of a semiconductor device 1 of an embodiment 1 of the invention.

Embodiments of the invention will now be described below with reference to the drawings. In the drawings, the same or similar parts and portions bear the same reference numbers.

[Embodiment 1]

FIG. 1 is a schematic block diagram showing a structure of a semiconductor device 1 of an embodiment 1 of the invention.

FIG. 1 is a block diagram which functionally shows a major structure of semiconductor device 1 of the embodiment 1 of the invention. More specifically, FIG. 1 shows, as an example of the semiconductor device, a structure of a functional portion relating to input/output data of one bit in a synchronous dynamic random access memory (which will be referred to as an "SDRAM" hereinafter) of x8-bit configuration operating in synchronization with a clock signal.

A memory cell array portion relating to a data I/O terminal DQi includes a memory cell array 71a forming a bank A and a memory cell array 71b forming a bank B.

Bank A is divided into memory cell array banks A0 and A1 to be selected in accordance with an address signal, and memory cell array bank B is also divided into memory cell array banks B0 and B1.

For each of memory cell array banks A0 and A1, there are arranged an X-decoder group 52a including a plurality of row decoders, which decode address signals X0–Xj, respectively, and select a corresponding row in memory cell array 71a, a Y-decoder group 53a including a plurality of column decoders, which decode column address signals Y1–Yk, respectively, and issuing a column select signal for selecting a corresponding column in memory cell array 71a, and a sense amplifier group 54a which detects and amplifies data of the memory cells connected to the selected row in memory cell array 71a.

X-decoder group 52a includes the row decoders arranged corresponding to the word lines in memory cell array 71a, respectively. In accordance with address signals X0–Xj, the corresponding row decoder sets the word line to the selected state.

Y-decoder group 53a includes the column decoders arranged correspondingly to the column select lines in memory cell array 71a, respectively. Each column select line sets four bit line pairs to the selected state. X-decoder group 52a and Y-decoder group 53a simultaneously set the memory cells of 4 bits in each of memory cell array banks A0 and A1. X- and Y-decoder groups 52a and 53a are activated by a bank designating signal BA. For each of memory cell array banks B0 and B1, there are arranged X- and Y-decoder groups 53a and 53b, which can be activated by a bank designating signal BB.

Bank A is further provided with internal data transmission lines (global I/O lines) for transmitting the data sensed and amplified by sense amplifier group 54a, and transmitting write data (i.e., data to be written) to the selected memory cells in memory cell array 71a. Memory cell array bank A0 is provided with a global I/O line bus GIO0, and memory cell array bank A1 is provided with global I/O line bus GIO1. Each global I/O line bus includes four pairs of global I/O line pairs for simultaneously transmitting data to or from the memory cells of 4 bits which are simultaneously selected.

A write register 59a, i.e., a register for writing and a write buffer group 60a are provided for global I/O line GIO0 of memory cell array A0. A write register 59a' and a write buffer group 60a' are provided for global I/O line GIO1 of memory cell array A1.

An input buffer 58a of a width of one bit produces an internal write data from input data sent to data I/O terminal DQi. A selector 69a is controlled by a selector control signal φSEA issued from a second control signal generating circuit 63, and selectively applies the output of input buffer 58a to write registers 59a or 59a'. More specifically, I/O buffer 58a is activated in response to an input buffer activating signal φDBA, and thereby produces the internal write data from the input data sent to data I/O terminal DQi. Selector 69a is controlled by selector control signal φSEA, which is issued from a second control signal generating circuit 63 in accordance with the address signal, and issues the internal write data to one of write registers 59a and 59a'. Write registers 59a and 59a' are activated in response to register activating signals φRwA0 and φRwA1, and successively store the write data sent from corresponding selectors 69a, respectively. Write buffer groups 60a and 60a40 are activated in response to write buffer activating signals φWBA0 and φWBA1, and thereby operate to amplify and transmit the data stored in corresponding write registers 59a and 59a' to global I/O line pair buses GIO0 and GIO1, respectively.

An equalize circuit group 61a is provided commonly to two global I/O line pairs GIO0 and GIO1, and is responsive to an equalize activating signal φWEQA to equalize global I/O line pairs GIO0 and GIO1.

Each of write buffer groups 60a and 60a40 as well as write registers 59a and 59a' has a width of 8 bits.

Memory cell bank B likewise includes memory cell array banks B0 and B1. Each of memory cell array banks B0 and B1 includes an X-decoder group 52b, a Y-decoder group 53b, a sense amplifier group 54b which is activated in response to sense amplifier activating signal φSAB, an equalize circuit group 61b which is activated in response to an equalize circuit activating signal φWEQB, write buffer groups 60b and 60b' which are activated in response to buffer activating signals φWBB0 and φWBB1, respectively, write registers 59b and 59b' which are activated in response to register activating signals φRwB0 and φRwB1, respectively, a selector 69b which is controlled by a selector control signal φSEB, and an input buffer 58b which is activated in response to a buffer activating signal φDBB.

The Banks A and B have the same structures. Owing to provision of write registers 59a and 59a' as well as 59b and 59b', input/output of data can be performed in synchronization with a fast clock signal.

The respective control signals for banks A and B are issued in accordance with bank designating signals BA and BB, respectively, and more specifically, the control signals for one of banks A and B are not issued when those for the other bank are issued.

A function block 100 shown in FIG. 1 is provided correspondingly to each data I/O terminal. In the case of SDRAM of x8-bit configuration, eight functional blocks 100 are provided correspondingly to the respective data I/O terminals, respectively.

By employing the banks A and B of the substantially same structures as well as bank designating signals BA and BB for selecting only one of the banks, banks A and B can operate substantially independently of each other.

As a control system for driving banks A and B independently of each other, there are arranged a first control signal generating circuit 62, a second control signal generating circuit 63 and a clock counter 64.

First control signal generating circuit 62 takes in externally supplied control signals, i.e., an external row address strobe signal ext./RAS, an external column address strobe signal ext./CAS, an external output enable signal ext./OE and an external write enable signal ext./WE in synchronization with external clock signal CLK, and issues internal control signals φxa, φya, φW, φO, φR and φC.

Second control signal generating circuit 63 responds to bank designating signals BA and BB, a lowest bit Y0 of the externally supplied address signal, internal control signals φW, φO, φR and φC, and the output of clock counter 64, and issues control signals for driving banks A and B independently of each other, i.e., equalize circuit activating signals φWEQA and φWEQB, sense amplifier activating signals φSAA and φSAB, write buffer activating signals φWBA0, φWBA1, φWBB0 and φWBB1, write register activating signals φRwA0, φRwA1, φRwB0 and φRwB1, selector control signals φSEA and φSEB, input buffer activating signals φDBA and φDBB, a signal CAS0 which becomes active (L-level) when timing of the internally sent control signal corresponds to the write operation, and a write decode enable signal WDE which becomes active (H-level) during the write operation.

Semiconductor device 1 further includes peripheral circuits, i.e., an X-address buffer 65 which responds to internal control signal φxa by taking in external address signals ext./A0 to ext./Ai, and issuing internal address signals X0–Xj and bank select signals BA and BB, and a Y-address buffer 66 which is activated in response to internal control signal φya, and issues column select signals Y0–Yk for designating the column select line.

Semiconductor device 1 further includes, as a peripheral circuit, a Y-address operation circuit 68 which operates under control by external clock signal CLK to receive the output signals of the Y-address buffer, i.e., column select signals Y0–Yk as well as signals CLK0 and WDE, and issue column address signals Y1–Yk and an Y-decoder activating signal ENCSL.

In the SDRAM described above, the operation mode is determined in accordance with values of the externally supplied control signals which are received in synchronization with external clock signal CLK. For example, the burst length, which is the number of bits of data to be continuously read or written, is set to 1, 2, 4 or 8 bits by changing the value in the mode register included in first control signal generating circuit 62 in accordance with the internally applied control signal. In addition to the above, the mode register holds, for example, a set value of the CAS latency and set values of interleave/sequential modes of the burst type.

The SDRAM does not always perform external transmission of data, and is generally on standby during, e.g., data processing by a microprocessor. In the standby state, the power consumption of the SDRAM can be effectively reduced by reducing the sub-threshold current of the MOS transistors. However, values such as the set value of the mode register described above are determined by external setting, and therefore the logical values which are held during standby are not uniquely determined.

If the logical values thus held were lost for reducing the sub-threshold currents, it would be necessary to set the data in the mode registers afresh before externally accessing the data after releasing from the standby. In view of this, a circuit structure which will be described below is employed for reducing the sub-threshold currents while statically holding the logical values on respective nodes.

The invention is aimed at reduction in sub-threshold current during standby, and the SDRAM has been described as an example of the semiconductor device. However, the invention is not restricted to the SDRAM or the like, and can also be applied to all the semiconductor devices such as microprocessors and logic LSIs provided with CMOS circuits.

Figure 2:
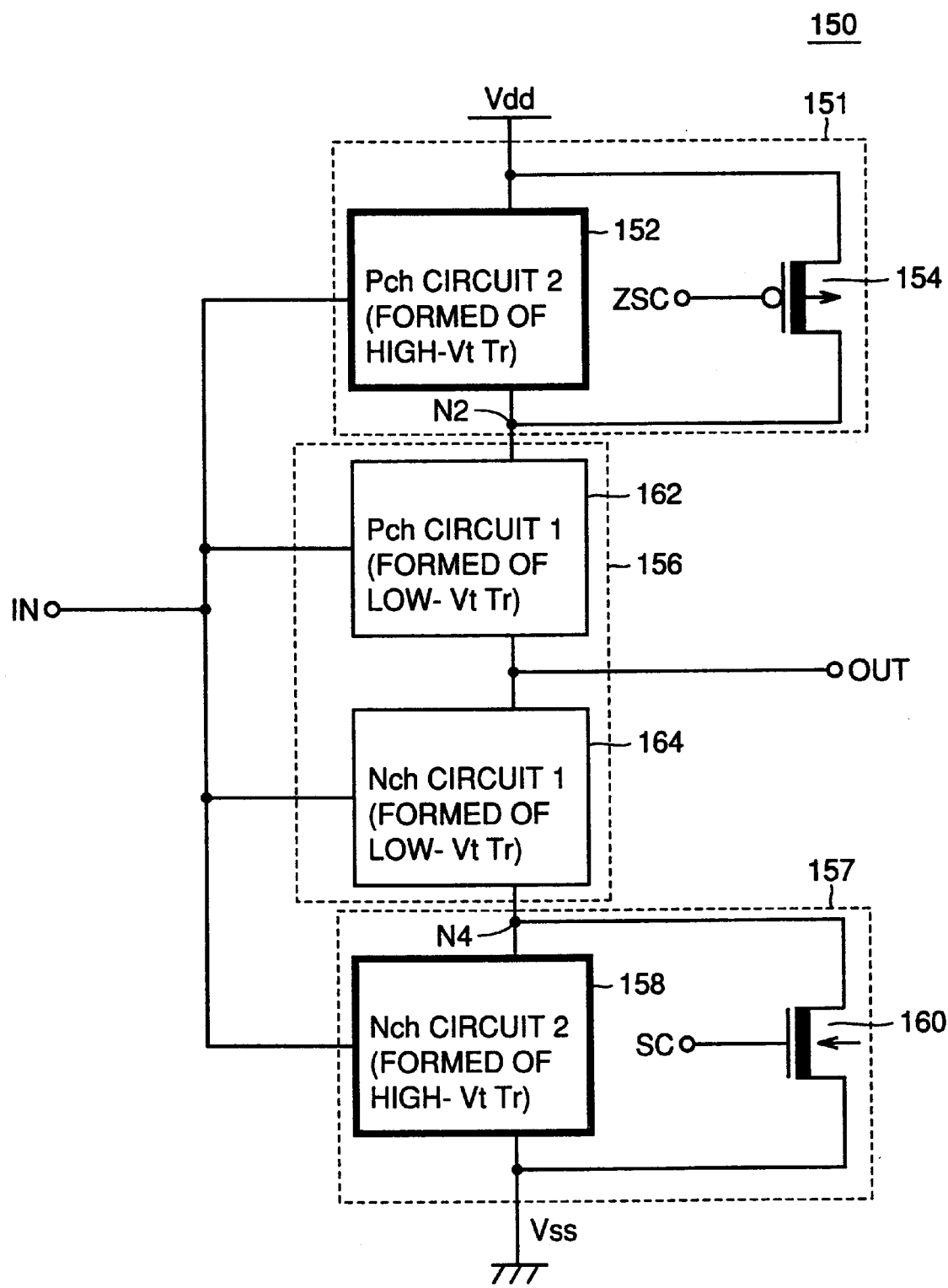
FIG. 2 is a schematic block diagram showing a structure of a circuit 150 used in a first control signal generating circuit 62 of semiconductor device 1.

FIG. 2 is a schematic block diagram showing a structure of a circuit 150 used in first control signal generating circuit 62 of semiconductor device 1.

Referring to FIG. 2, circuit 150 includes a CMOS circuit 156 which receives input signal IN and issues output signal OUT corresponding to the value of input signal IN, a connection circuit 151 which connects the power supply node supplied with power supply potential Vdd to a node N2 in with input signal IN and control signal ZSC, and a connection circuit 157 which connects a node N4 to the ground node supplied with the ground potential in accordance with input signal IN and control signal SC. The ground node and the power supply node of CMOS circuit 156 are connected to nodes N4 and N2, respectively.

Connection circuit 151 includes a second Pch circuit 152 which connects the power supply node receiving power supply potential Vdd to node N2 in accordance with input signal IN, and a P-channel MOS transistor 154 which receives control signal ZSC on its gate, and connects the power supply node supplied with power supply potential Vdd to node N2.

Connection circuit 157 includes a second Nch circuit 158 which connects node N4 to the ground node supplied with the ground potential in accordance with input signal IN, and an N-channel MOS transistor 160 which receives control signal SC on its gate, and connects node N4 to the ground node supplied with ground potential Vss.

CMOS circuit 156 includes a first Pch circuit 162 which connects node N2 to the output node of output signal OUT in accordance with input signal IN, and a first Nch circuit 164 which connects node N4 to the output node of output signal OUT in accordance with input signal IN.

Second Pch circuit 152 has a structure similar to that of first Pch circuit 162. First Pch circuit 162 is formed of P-channel MOS transistors which have threshold voltages of small absolute value and are suitable to fast operation. Second Pch circuit 152 is formed of P-channel MOS transistors which cause sufficiently small sub-threshold currents and have threshold voltages of large absolute values.

Second Nch circuit 158 has a structure similar to that of first Nch circuit 164. First Nch circuit 164 is formed of N-channel MOS transistors which have threshold voltages of small absolute values and are suitable to fast operation. Second Nch circuit 158 is formed of N-channel MOS transistors which cause sufficiently small sub-threshold currents and have threshold voltages of large absolute values.

Control signal SC is at H-level when circuit 150 is in the operating state, and thereby N-channel MOS transistor 160 couples node N4 to ground potential Vss. Control signal ZSC is at L-level when circuit 150 is in the operating state, and thereby P-channel MOS transistor 154 couples node N2 to power supply potential Vdd.

When circuit 150 is on standby, control signal SC is at L-level, and control signal ZSC is at H-level so that N- and P-channel MOS transistors 160 and 154 are both in non-conductive state or off.

In FIG. 2, input signal IN is represented by one signal line. However, it can be considered that similar operations are performed in the case where a plurality of signal lines are employed. When input signal IN is of a predetermined value, first Pch circuit 162 interrupts the connection between the output node and node N2. Second Pch circuit 152 has a structure similar to that of first Pch circuit 162, and therefore node N2 is simultaneously isolated from the node supplied with power supply potential Vdd. In this case, the sub-threshold current during standby flows between the output node and the power supply node through second and first Pch circuits 152 and 162.

Since second Pch circuit 152 has the threshold voltage of a large absolute value, the sub-threshold current which flows during the cut-off state is sufficiently small. In this case, therefore, the sub-threshold current flowing through first and second circuits 162 and 152 is restricted by second Pcn circuit 152 to a sufficiently small value.

The sub-threshold current can likewise be reduced in the case where first and second Nch circuits 164 and 158 are off.

In circuit 150, as already described, the sub-threshold current can be effectively reduced in either of the cases where input signal IN is at H-level and it is at L-level.

Figure 3:
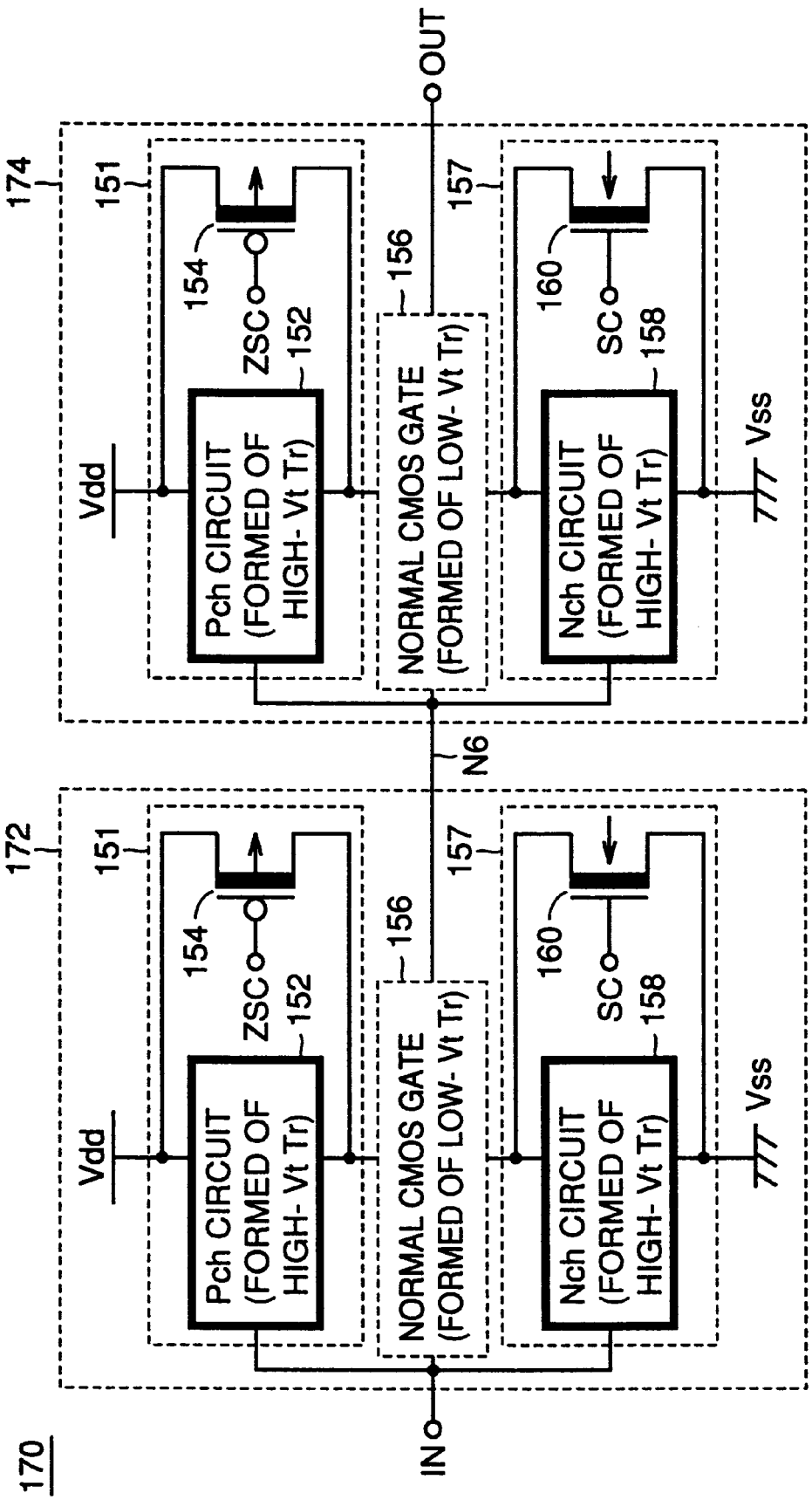
FIG. 3 is a schematic block diagram showing a structure of a circuit 170 including a series connection of circuits 150 described with reference to FIG. 2.

FIG. 3 is a schematic block diagram showing a structure of a circuit 170 including circuits, which are connected in series and are the same as circuit 150 shown in FIG. 2.

Referring to FIG. 3, circuit 170 includes a circuit 172 supplying the output signal to a node N6 in accordance with input signal IN, and a circuit 174 issuing output signal OUT in accordance with the potential on node N6.

Circuits 172 and 174 have the same structures as circuit 150 already described with reference to FIG. 2, and description will not be repeated.

As shown in FIG. 3, the circuits which are the same as circuit 150 already described with reference to FIG. 2 can be connected continuously, similarly to the ordinary CMOS circuit, and can hold the output during standby in either of the cases where the input signal is at H-level and is at L-level. Accordingly, the structure is suitable to reduction in sub-threshold current in a large-scale circuit.

Specific circuit structures will now be described below.

Figures 4, 5:
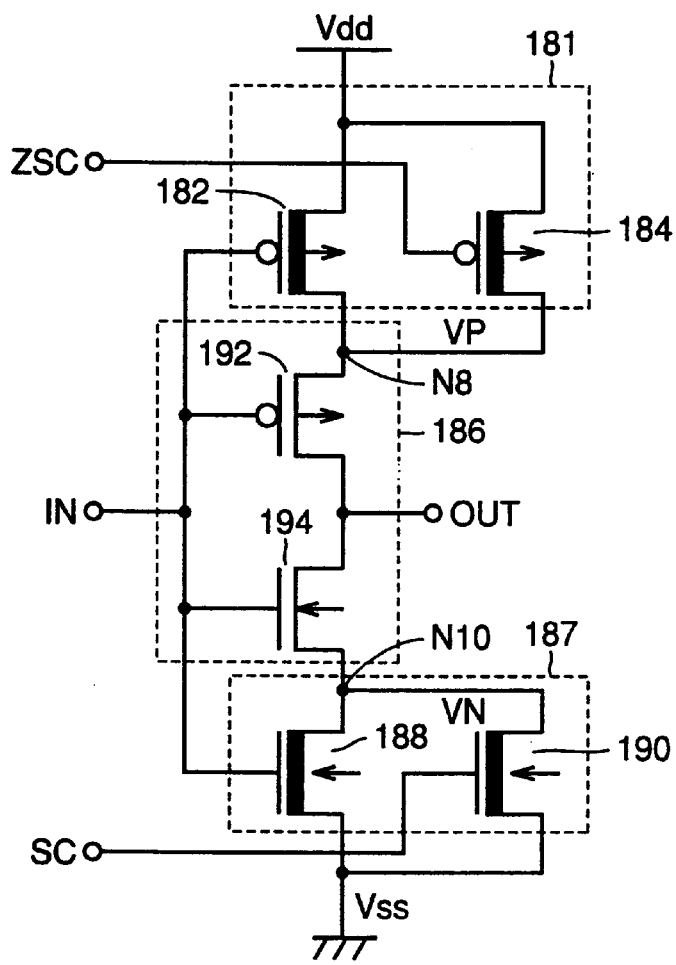
FIG. 4 is a circuit diagram showing a structure of a circuit 180 employing circuit 150 as an inverter.
FIG. 5 shows a relationship between the input and output of circuit 180.

FIG. 4 is a circuit diagram showing a structure of a circuit 180 which employs circuit 150 as an inverter.

Referring to FIG. 4, circuit 180 includes a connection circuit 181 which connects the power supply node supplied with power supply potential Vdd to a node N8 in accordance with input signal IN and control signal ZSC, an inverter 186 which receives and inverts input signal IN for issuing output signal OUT, and a connection circuit 187 which connects the ground node supplied with ground potential Vss to a node N10 in accordance with input signal IN and control signal SC. The power supply node of inverter 186 is connected to node N8, and the ground node of inverter 186 is connected to node N10.

Connection circuit 181 includes a P-channel MOS transistor 182 which receives input signal IN on its gate, and has a source connected to the power supply node supplied with power supply potential Vdd and a drain connected to node N8, and a P-channel MOS transistor 184 which receives control signal ZSC on its gate, and has a source connected to the power supply node supplied with power supply potential Vdd and a drain connected to node N8.

Connection circuit 187 includes an N-channel MOS transistor 188 which receives input signal IN on its gate, and has a source connected to the ground node supplied with ground potential Vss and a drain connected to node N10, and an N-channel MOS transistor 190 which receives control signal SC on its gate, and has a source connected to the ground node and a drain connected to node N10.

Inverter 186 includes a P-channel MOS transistor 192 which receives input signal IN on its gate, and has a source connected to node N8 and a drain connected to the output node issuing output signal OUT, and an N-channel MOS transistor 194 which receives input signal IN on its gate, and has a source connected to node N10 and a drain connected to the output node issuing output signal OUT.

Circuit 180 operates as described below.

FIG. 5 shows a relationship between the input and output of circuit 180.

Figure 6:
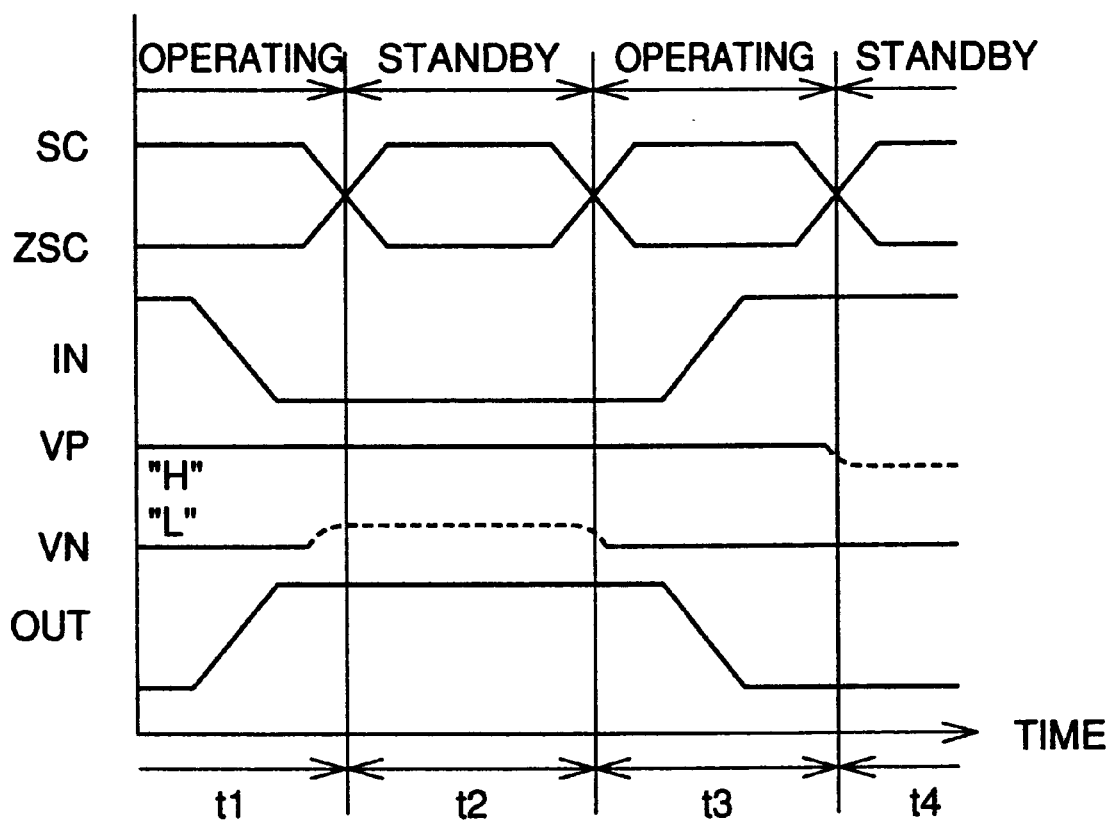
FIG. 6 is an operation waveform diagram showing an operation of circuit 180.

FIG. 6 is an operation waveform diagram showing the operation of circuit 180.

Referring to FIGS. 5 and 6, control signals SC and ZSC are at H- and L-level during a period t1, respectively. In this state, P- and H-channel MOS transistors 184 and 190 are on so that VP which is the potential on node N8 is equal to power supply potential Vdd, and VN which is the potential on node N10 is equal to ground potential Vss.

When input signal IN is at H-level, N-channel MOS transistor 194 is on, and P-channel MOS transistor 192 is off. Therefore, output signal OUT is at L-level. When input signal IN changes to L-level, N-channel MOS transistor 194 is turned off, and P-channel MOS transistor 192 is turned on so that output signal OUT attains H-level.

During a subsequent period t2, control signals SC and ZSC are set to L- and H-levels, respectively, and circuit 180 is set to the standby state. During period t2, the standby state is kept while input signal IN is at L-level. In accordance with the potentials of control signals ZSC and SC, P- and N-channel MOS transistors 184 and 190 are turned off. During period t2, since input signal IN is at L-level, P-channel MOS transistors 182 and 192 are on, and N-channel MOS transistors 194 and 188 are off.

Accordingly, potential VP on node N8 and output signal OUT are at H-level. Node N10 is in the state close to the high impedance state because all N-channel MOS transistors 194, 188 and 190 are off. In this state, node N10 carries a potential causing in N-channel MOS transistor 194 the flow of a current which is equal in value to an extremely small sub-threshold current flowing through N-channel MOS transistors 188 and 190 having threshold voltages larger in absolute value than that of N-channel MOS transistor 194.

During a subsequent period t3, circuit 180 enters the operating state again. In this state, control signals SC and ZSC are at H- and L-levels, respectively. Thereby, P- and N-channel MOS transistors 184 and 190 are on so that potential VP on node N8 is at H-level, and potential VN on node N10 is at L-level. In this state, inverter 186 performs the normal operation so that output signal OUT changes from H-level to L-level when input signal IN changes from L-level to H-level.

During a subsequent period t4, circuit 180 enters the standby state again. This standby state is kept while input signal IN is at H-level. Control signals SC and ZSC are at L- and H-levels, respectively. Therefore, N- and P-channel MOS transistors 190 and 184 are off. In this state, since input signal IN is at H-level, both P-channel MOS transistors 182 and 192 are off, both N-channel MOS transistors 194 and 188 are on so that output signal OUT and potential VN on node N10 are both at L-level. Since all P-channel MOS transistors 182, 184 and 192 are off, node N8 is in the state close to the high impedance state. In this state, node N8 carries a potential causing in P-channel MOS transistor 192 the flow of a sub-threshold current which is equal in value to an extremely small sub-threshold current flowing through P-channel MOS transistors 182 and 184 having threshold voltages of large absolute values.

As described above, circuit 180 can reduce the sub-threshold current in either of the cases where the input during standby is at H-level and is at L-level.

Description will not be given on a continuous connection of circuits 180.

Figure 7:
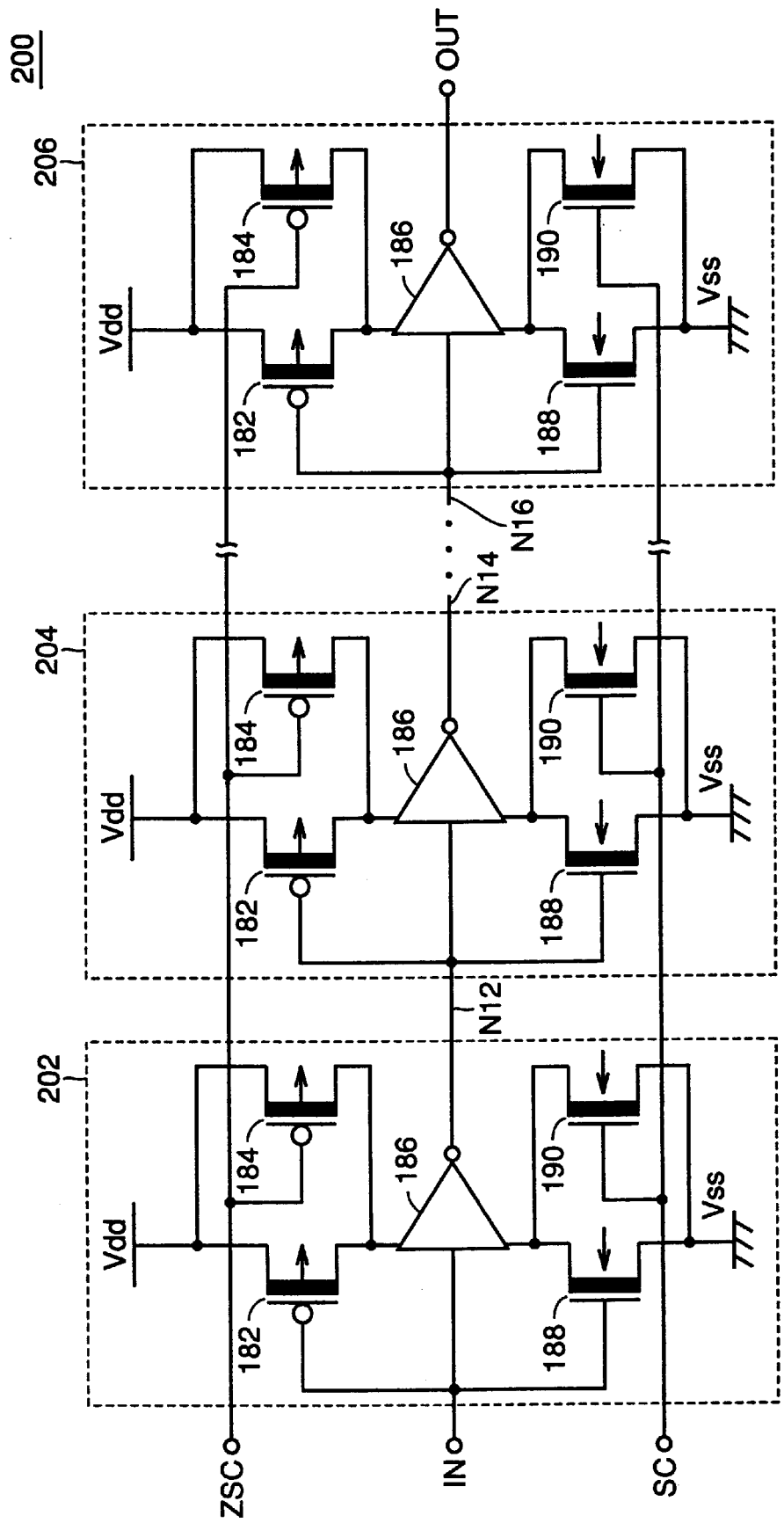
FIG. 7 is a circuit diagram showing a structure of a circuit 200 including inverters connected continuously to each other.

FIG. 7 is a circuit diagram showing a structure of a circuit 200 including a continuous connection of inverters.

Referring to FIG. 7, circuit 200 includes a circuit 202 which receives and inverts input signal IN for outputting the same onto a node N12, a circuit 204 which receives and inverts the potential on node N12 for outputting the same onto a node N14, and a circuit 206 which receives and inverts the potential on node N16 for issuing output signal OUT. Circuits which are similar to circuits 202–206 are connected in series between nodes N14 and N16. Circuits 202–206 receive control signals ZSC and SC.

Structures of circuits 202–206 are the same as that of circuit 180 shown in FIG. 4, and therefore description will not be repeated.

By using circuit 180 in FIG. 4, the circuits can be continuously arranged and connected together regardless of logical values held on signal transmission nodes during standby. Since P-channel MOS transistor 182 and N-channel MOS transistor 188 are switched between on and off states in accordance with the value of input signal, the potentials on nodes N12, N14 and N16 as well as the potential of output signal OUT are not reduced in logical amplitude even during standby, as can be done in an ordinary CMOS circuit.

According to the semiconductor device of the embodiment 1, as already described, the sub-threshold current can be reduced in either of the cases where the input during standby is at H-level and is at L-level, and further continuous arrangement and connection are allowed regardless of the logical values held on the signal transmission nodes during standby.

[Embodiment 2]

The semiconductor device of the embodiment 2 differs from the embodiment 1 in that the invention is applied to an NAND circuit instead of the inverter.

Figure 8:
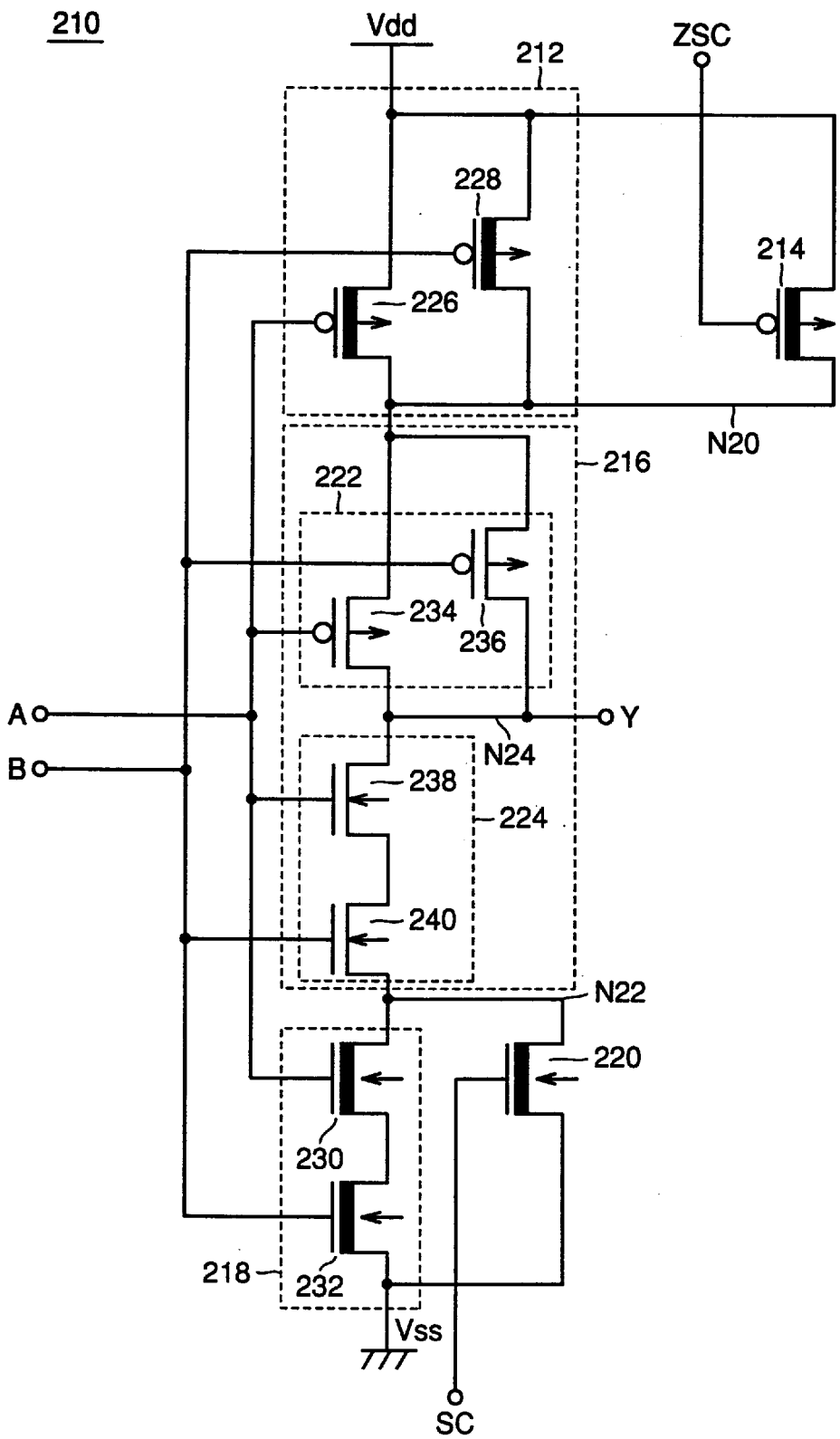
FIG. 8 is a circuit diagram of a circuit 210 in which the invention is applied to an NAND circuit used in a semiconductor device of an embodiment 2.

FIG. 8 is a circuit diagram of a circuit 210, in which the invention is applied to a NAND circuit used in the semiconductor device of the embodiment 2.

Referring to FIG. 8, circuit 210 includes a P-channel MOS transistor 214 which receives control signal ZSC on its gate, and has a source connected to the power supply node supplied with power supply potential Vdd and a drain connected to a node N20, a second Pch circuit 212 which connects the power supply node supplied with power supply potential Vdd to node N20 in accordance with the values of input signals A and B, an N-channel MOS transistor 220 which receives control signal SC on its gate, and has a drain connected to a node N22 and a source connected to the ground node supplied with ground potential Vss, a second Nch circuit 218 which connects node N22 to the ground node supplied with ground potential Vss in accordance with input signals A and B, and an NAND circuit 216 which receives input signals A and B, and issues an NAND between them as an output signal Y.

The power supply node of NAND circuit 216 is connected to node N20, and the ground node of NAND circuit 216 is connected to node N22.

NAND circuit 216 has a first Pch circuit 222 which connects nodes N20 and N24 together in accordance with input signals A and B, a first Nch circuit 224 which connects nodes N24 and N22 together in accordance with input signals A and B.

The potential on node N24 becomes equal to the potential of output signal Y.

First Pch circuit 222 includes a P-channel MOS transistor 234 which receives input signal A on its gate, and has a source connected to node N20 and a drain connected to node N24, and a P-channel MOS transistor 236 which receives input signal B on its gate, and has a source connected to node N20 and a drain connected to node N24.

First Nch circuit 224 includes N-channel MOS transistors 238 and 240 which receive input signals A and B on their gates, respectively, and are connected in series between nodes N24 and N22.

Second Nch circuit 218 includes N-channel MOS transistors 230 and 232 which receive input signals A and B on their gates, respectively, and are connected in series between node N22 and the ground node supplied with ground potential Vss.

Second Pch circuit 212 includes a P-channel MOS transistor 226 which receives input signal A on its gate, and has a source connected to the power supply node supplied with power supply potential Vdd and a drain connected to node N20, and a P-channel MOS transistor 228 which receives input signal B on its gate, and has a source connected to the power supply node supplied with power supply potential Vdd and a drain connected to node N20.

Circuit 210 operates as follows.

FIG. 9 shows a relationship between input and output signals of circuit 210.

Referring to FIGS. 8 and 9, when control signals SC and ZSC are at H- and L-levels, respectively, N- and P-channel MOS transistors 220 and 214 are on, and circuit 210 is in the normal operation state. In this state, NAND circuit 216 can operate fast, and output signal Y is at H-level when input signals A and B exhibit the relationship of (A, B)=(L, L), (L, H) or (H, L). When input signals A and B exhibit the relationship of (A, B)=(H, H), output signal Y is at L-level.

When control signals SC and ZSC are at L- and H-levels, respectively, circuit 210 is on standby. In this state, when input signals A and B exhibit the relationship of (A, B)=(L, L), (L, H) or (H, L), output signal Y is at H-level, but either one or both of N-channel MOS transistors 230 and 232 are off. Since N-channel MOS transistor 220 is off, the sub-threshold current in circuit 210 which flows from output node N24 toward the node receiving ground potential Vss takes on an extremely small value, which is determined by N-channel MOS transistors 230, 232 and 220 having threshold voltages of large absolute values.

When input signals A and B exhibit the relationship of (A, B)=(H, H), all N-channel MOS transistors 238, 240, 230 and 232 are on, and all P-channel MOS transistors 226, 228, 234 and 236 are off so that output signal Y is at L-level. In this state, the sub-threshold current takes on an extremely small value, which is determined by P-channel MOS transistors 226, 228 and 214 having threshold voltages of large absolute values.

Although FIG. 8 shows the structure in which the invention is applied to the NAND circuit having two inputs, the invention can be applied to an NAND circuit having more inputs.

In the embodiment 2, the sub-threshold current can likewise be reduced while holding the output signal in either of the cases where the input signal is at L-level and at H-level.

[Embodiment 3]

A semiconductor device of an embodiment 3 differs from the embodiment 1 in that the invention is applied to an NOR circuit instead of the inverter.

Figure 10:
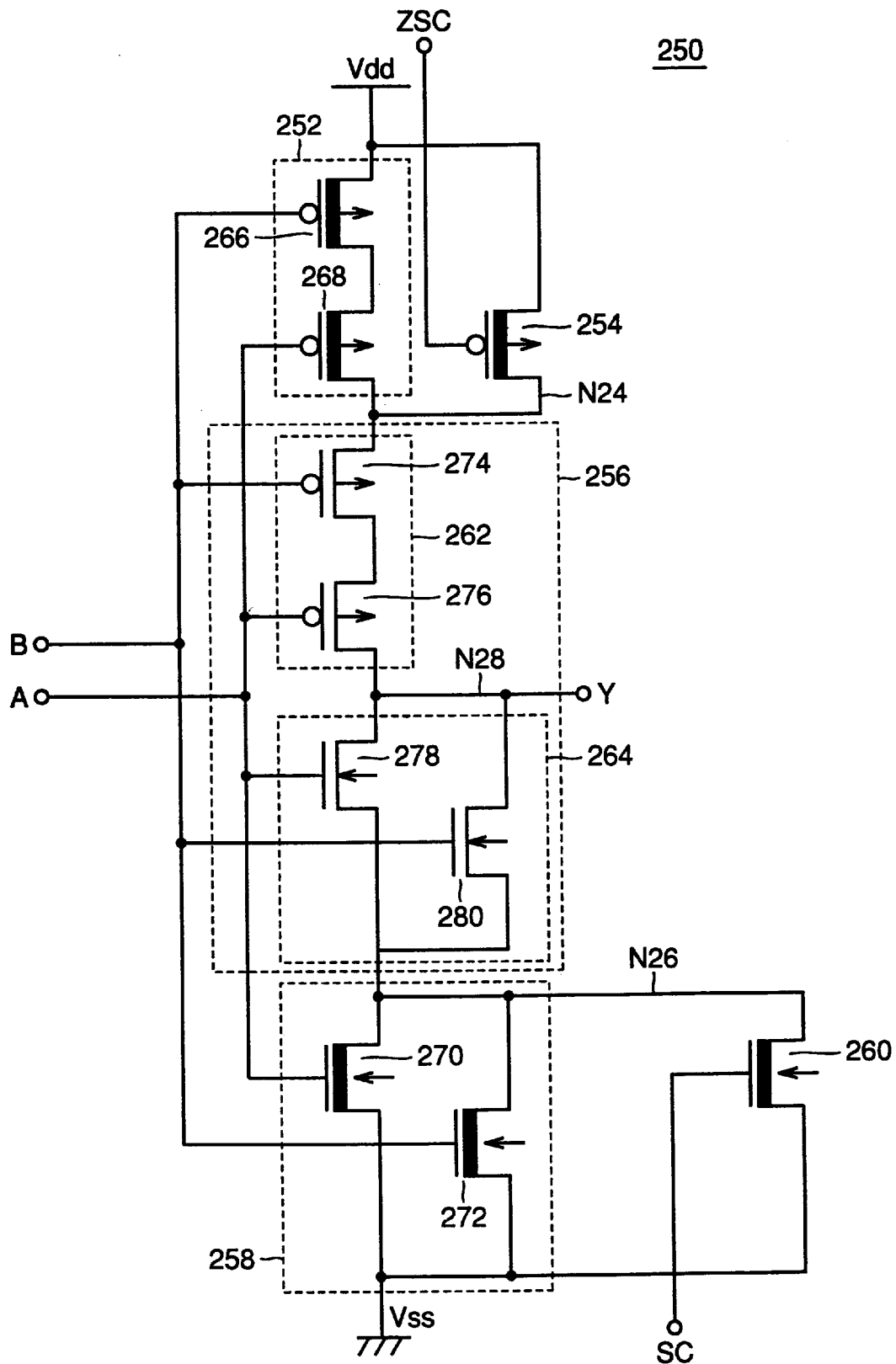
FIG. 10 is a circuit diagram showing a structure of a circuit 250 in which the invention is applied to an NOR circuit.

FIG. 10 is a circuit diagram showing a structure of a circuit 250, in which the invention is applied to the NOR circuit.

Referring to FIG. 10, circuit 250 includes a P-channel MOS transistor 254 which receives control signal ZSC, and has a source connected to the power supply node supplied with power supply potential Vdd and a drain connected to node N24, a second Pch circuit 252 which connects the power supply node supplied with power supply potential Vdd to node N24 in accordance with the values of input signals A and B, an N-channel MOS transistor 260 which receives control signal SC on its gate, and has a drain connected to a node N26 and a source connected to the ground node supplied with ground potential Vss, a second Nch circuit 258 which connects node N26 to the power supply node in accordance with input signals A and B, and an NOR circuit 256 which receives input signals A and B, and issues an NAND between them as output signal Y.

The power supply node of NOR circuit 256 is connected to node N24, and the ground node of NOR circuit 256 is connected to node N26.

NOR circuit 256 includes a first Pch circuit 262 which connects node N24 to a node N28 in accordance with input signals A and B, and a first Nch circuit 264 which connects node N28 to node N26 in accordance with input signals A and B.

The potential on node N28 is equal to the potential of output signal Y.

Second Pch circuit 252 includes P-channel MOS transistors 266 and 268, which receive input signals B and A on their gates, respectively, and are connected in series between the power supply node supplied with power supply potential Vdd and node N24.

First Pch circuit 262 includes P-channel MOS transistors 274 and 276, which receive input signals B and A on their gates, respectively, and are connected in series between nodes N24 and N28.

Second Nch circuit 258 includes an N-channel MOS transistor 270 which receives input signal A on its gate, and has a drain connected to node N26 and a source connected to the ground node supplied with ground potential Vss, and an N-channel MOS transistor 272 which receives input signal B on its gate, and has a drain connected to node N26 and a source connected to the ground node supplied with ground potential Vss.

First Nch circuit 264 includes an N-channel MOS transistor 278 which receives input signal A on its gate, and has a source connected to node N26 and a drain connected to node N28, and an N-channel MOS transistor 280 which receives input signal B on its gate, and has a source connected to node N26 and a drain connected to node N28.

The potential on node N28 is equal to the potential of output signal Y.

Each of P-channel MOS transistors 266, 268 and 254 as well as N-channel MOS transistors 270, 272 and 260 is formed of an MOS transistor, which has a threshold voltage of a large absolute value and causes a small sub-threshold current during the off state.

Circuit 250 operates as follows.

FIG. 11 shows a relationship between input and output signals of circuit 250.

Referring to FIGS. 10 and 11, when control signals SC and ZSC are at H- and L-level, respectively, circuit 250 performs the normal operation. In this state, both P- and N-channel MOS transistors 254 and 260 are on so that the potential on node N24 becomes equal to power supply potential Vdd, and the potential on node N26 becomes equal to ground potential Vss. In this state, NOR circuit 256 can operate fast in accordance with change in input signals A and B.

More specifically, when input signals A and B exhibit the relationship of (A, B)=(L, L), output signal Y is at H-level. When input signals A and B exhibit the relationship of (A, B)=(L, H), (H, L) or (H, H), output signal Y is at L-level.

When control signals SC and ZSC are at L- and H-levels, respectively, circuit 250 is on standby. In this state, when both input signals A and B are at L-level, output signal Y is at H-level, and all N-channel MOS transistors 278, 280, 270 and 272 are off so that the sub-threshold current flowing from node N28 toward the ground node is formed of an extremely small current flowing through N-channel MOS transistors 270, 272 and having the threshold voltages of large absolute values.

When input signals A and B exhibit the relationship of (A, B)=(L, H), (H, L) or (H, H), output signal Y is at L-level, any one of P-channel MOS transistors 266 and 268 is off, and P-channel MOS transistor 254 is off. Therefore, the sub-threshold current flowing from the power supply node supplied with power supply potential Vdd to node N28 is formed of an extremely small current flowing through P-channel MOS transistors 266, 268 and 254 having threshold voltages of large absolute values.

In the semiconductor device of the embodiment 3, therefore, the sub-threshold current can be reduced while holding the level of the output signal regardless of combinations of the states of the input signals.

[Embodiment 4]

A semiconductor device of an embodiment 4 differs from that of the embodiment 1 in that the invention is applied to a clocked inverter instead of the inverter.

Figure 12:
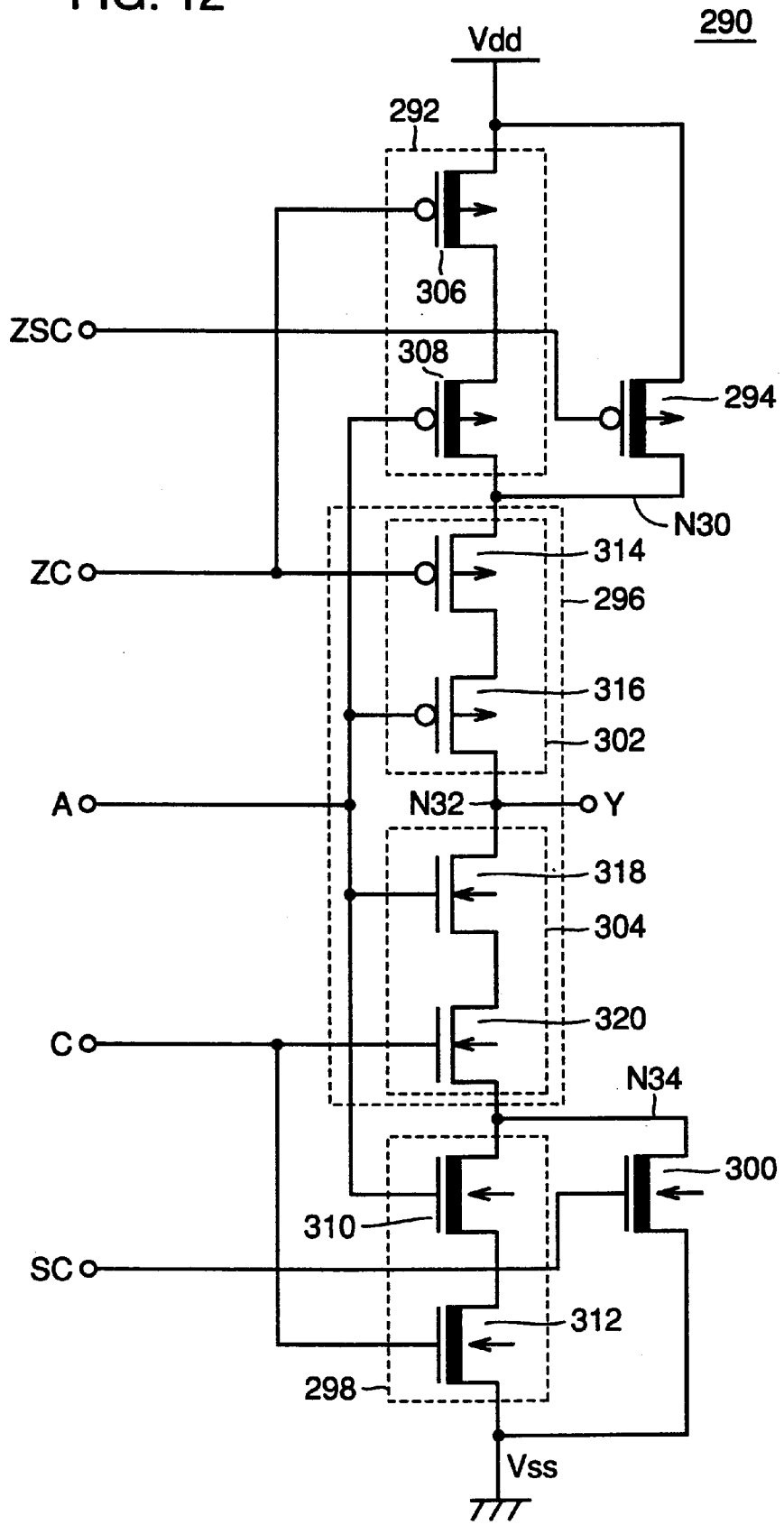
FIG. 12 is a circuit diagram showing a structure of a circuit 290, in which the invention is applied to a clocked inverter.

FIG. 12 is a circuit diagram showing a structure of a circuit 290 in which the invention is applied to the clocked inverter.

Referring to FIG. 12, circuit 290 includes a P-channel MOS transistor 294 which receives control signal ZSC on its gate, and has a source connected to the power supply node supplied with power supply potential Vdd and a drain connected to a node N30, a second Pch circuit 292 which connects the power supply node supplied with power supply potential Vdd to node N30 in accordance with the values of input signal A and a clock signal ZC, an N-channel MOS transistor 300 which receives control signal SC on its gate, and has a drain connected to a node N34 and a source connected to the ground node supplied with ground potential Vss, a second Nch circuit 298 which connects node N34 to the ground node supplied with ground potential Vss in accordance with input signal A and a clock signal C, and a clocked inverter 296 which receives input signal A, and issues, as output signal Y, the inverted signal when clock signals ZC and C are active.

The power supply node of clocked inverter 296 is connected to node N30, and the ground node of clocked inverter 296 is connected to node N34.

Clocked inverter 296 includes a first Pch circuit 302 which connects node N30 to a node N32 in accordance with input signal A and clock signal ZC, and a first Nch circuit 304 which connects node N34 to node N32 in accordance with input signal A and clock signal C.

The potential on node N32 is equal to the potential of output signal Y.

Second Pch circuit 292 includes P-channel MOS transistors 306 and 308 which receive control signal ZC and input signal A on their gates, respectively, and are connected in series between power supply node supplied with power supply potential Vdd and node N30.

First Pch circuit 302 includes P-channel MOS transistors 314 and 316 which receive control signal ZC and input signal A on their gates, respectively, and are connected in series between nodes N30 and N32.

Second Nch circuit 298 includes N-channel MOS transistors 310 and 312 which receive input signal A and clock signal C on their gates, respectively, and are connected in series between node N34 and the ground node supplied with ground potential Vss.

First Nch circuit 304 includes N-channel MOS transistors 318 and 320 which receive input signal A and clock signal C on their gates, respectively, and are connected in series between nodes N32 and N34.

The potential on node N32 is equal to the potential of output signal Y.

Circuit 290 operates as follows.

FIG. 13 shows a relationship between the input and output signals of circuit 290.

Referring to FIGS. 12 and 13, when control signals SC and ZSC are at H- and L-level, respectively, circuit 290 performs the normal operation.

In this state, both P- and N-channel MOS transistors 294 and 300 are on, and the potential on node N30 becomes equal to power supply potential Vdd, and the potential on node N34 becomes equal to ground potential Vss. Clocked inverter 296 can perform the fast operation.

In this state, when clock signals ZC and C are at L- and H-levels, respectively, clocked inverter 296 issues the inverted signal of input signal A as output signal Y. Thus, when input signal A is at L-level, output signal Y is H-level. When input signal is at H-level, output signal Y is at L-level.

When clock signal ZC is at H-level and clock signal C is at L-level, output signal Y is in the high impedance state in either of the cases where input signal A is at L-level and at H-level.

When control signals SC and ZSC are at L- and H-levels, respectively, circuit 290 is on standby. Both P- and N-channel MOS transistors 294 and 300 are off. In this state, when clock signal ZC is at L-level and clock signal C is at H-level, P-channel MOS transistors 292 and 314 as well as N-channel MOS transistors 320 and 312 are all on. Also, output signal Y maintains H-level when input signal A is at L-level. Further, all N-channel MOS transistors 310, 312 and 300 having threshold voltages of large absolute values are off. Therefore, the current flowing from output node N32 toward the ground node is formed of an extremely small sub-threshold current determined by N-channel MOS transistors 310, 312 and 300 having large threshold voltages of large absolute value.

When input signal A is at H-level, output signal Y is at L-level, and both P-channel MOS transistors 306 and 308 are off. Therefore, the sub-threshold current flowing from the power supply node toward output node N32 is of an extremely small value which is determined by P-channel MOS transistors 306, 308 and 294 having large threshold voltages of large absolute value.

When clock signals ZC and C are at H- and L-levels, respectively, output signal Y holds the high impedance state in either of the cases where input signal A is at L-level and at H-level.

In this case, the sub-threshold current is likewise of an extremely small value determined by P- or N-channel MOS transistors having threshold voltages of large absolute values.

In the semiconductor device of the embodiment 4, it is likewise possible to reduce the sub-threshold current while holding the output signal in such a situation that there are several practical combinations of the states of input signals.

[Modification 1 of Embodiment 4]

Figure 14:
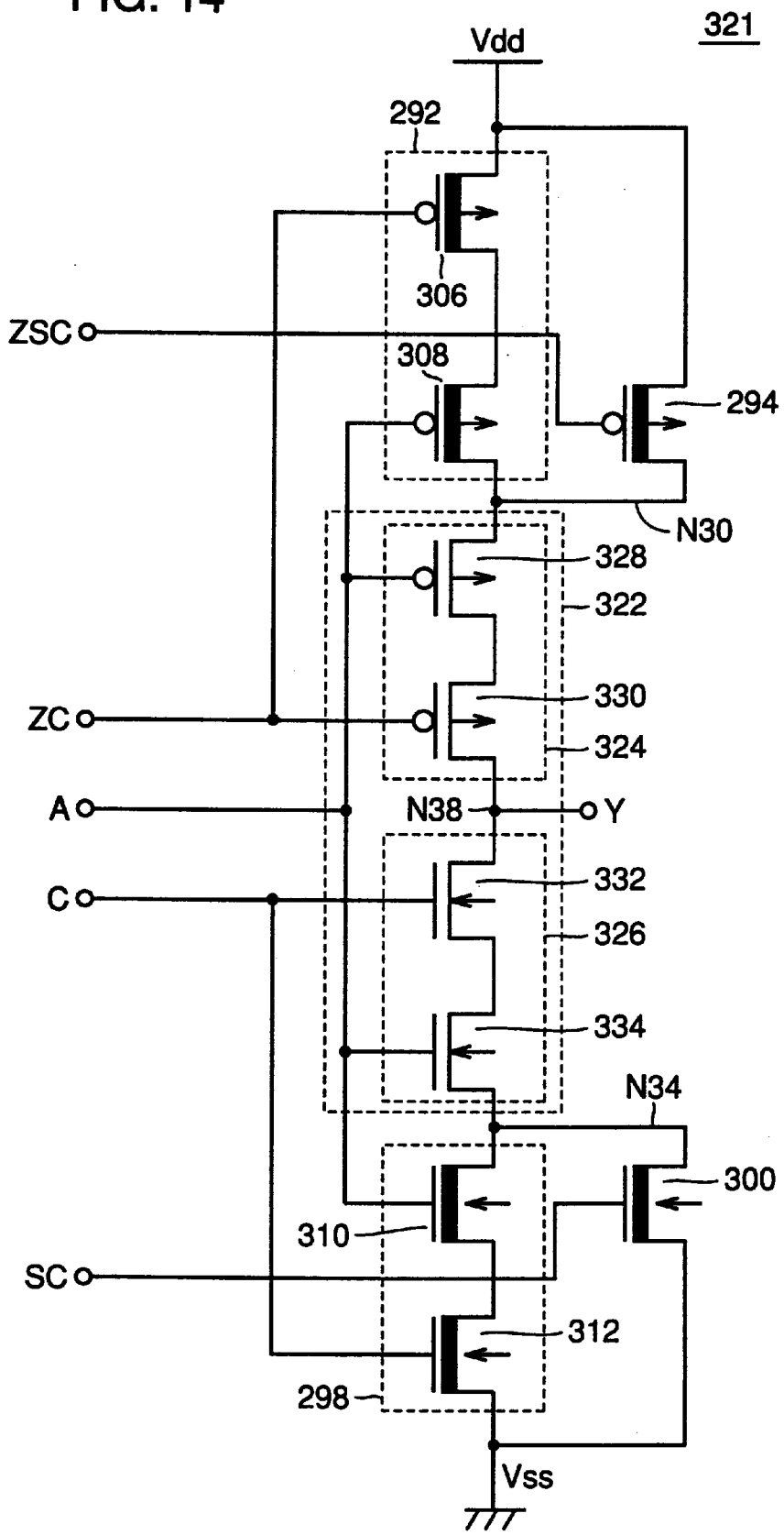
FIG. 14 is a circuit diagram showing a structure of a circuit 321 of a modification 1 of the embodiment 4.

FIG. 14 is a circuit diagram showing a structure of a circuit 321 of a modification 1 of the embodiment 4.

Referring to FIG. 14, circuit 321 of the modification 1 of the embodiment 4 differs from the circuit of the embodiment 4 in that clocked inverter 296 is replaced with a clocked inverter 322. Clocked inverter 322 has a structure different from clocked inverter 296.

Clocked inverter 322 has a power supply node connected to node N30 and a ground node connected to node N34.

Clocked inverter 322 includes a first Pch circuit 324 which connects node N30 to a node N38 in accordance with input signal A and clock signal ZC, and a first Nch circuit 326 which connects node N38 to node N34 in accordance with input signal A and clock signal C.

The potential on node N38 is equal to the potential of output signal Y.

First Pch circuit 324 includes P-channel MOS transistors 328 and 330 which receive input signal A and clock signal ZC on their gates, respectively, and are connected in series between nodes N30 and N38.

First Nch circuit 326 includes N-channel MOS transistors 332 and 334 which receive clock signal C and input signal A on their gates, respectively, and are connected in series between nodes N38 and N34.

Structures other than the above are the same as those of circuit 290 of the embodiment 4, and therefore description will not be repeated.

FIG. 15 shows a relationship between the input and output signals of circuit 321.

Circuit 321 of the modification 1 of the embodiment 4 operates similarly to circuit 290 of the embodiment 4, and therefore description will not be repeated.

In the semiconductor device of the modification 1 of the embodiment 4, it is likewise possible to reduce the sub-threshold current while holding the output signal in such a situation that there are several practical combinations of the states of input signals.

[Embodiment 5]

A semiconductor device of an embodiment 5 differs from that of the embodiment 1 in that the invention is applied to an NAND RS latch circuit instead of the inverter.

Figure 16:
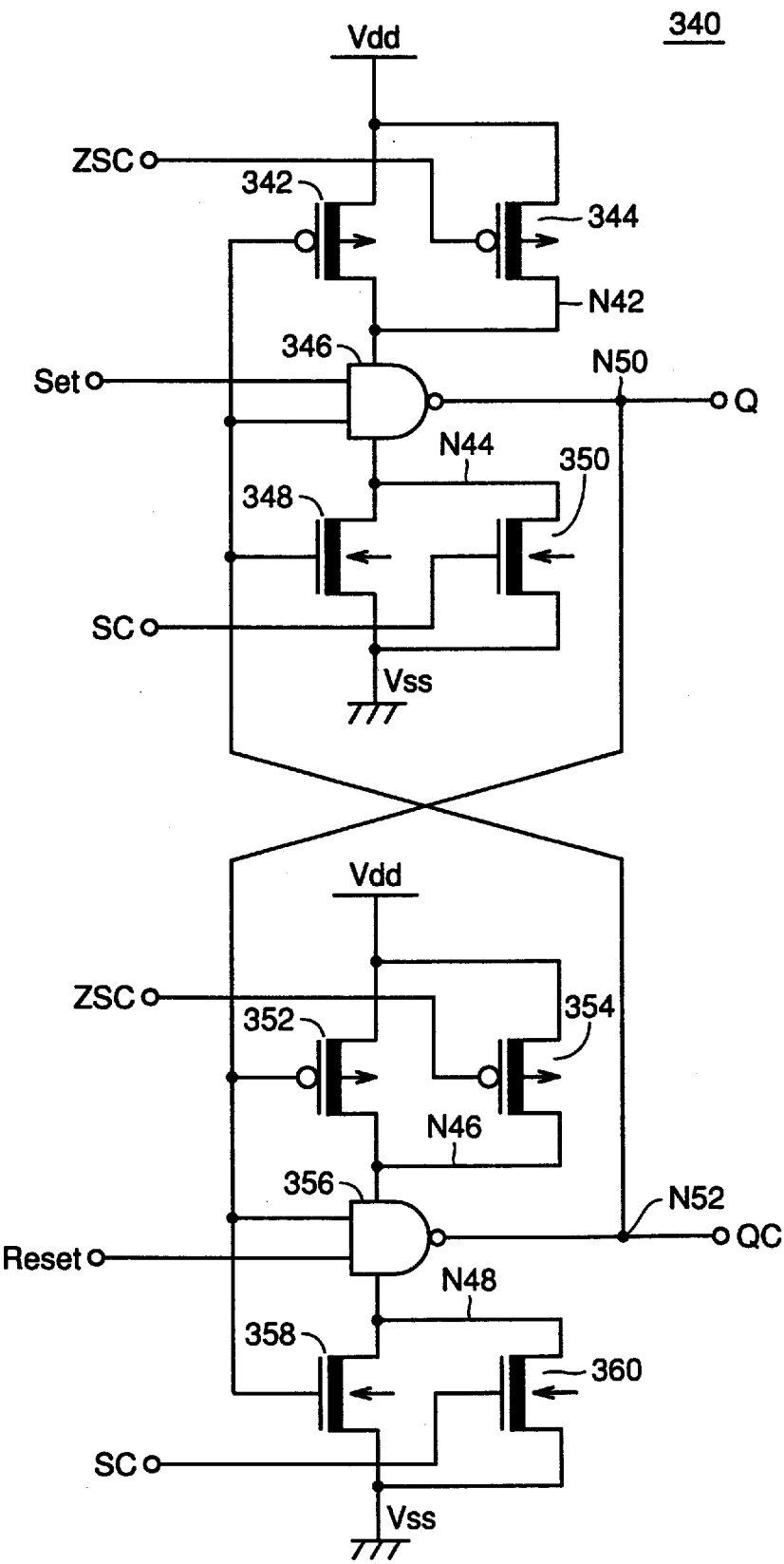
FIG. 16 is a circuit diagram showing a structure of a circuit 340, in which the invention is applied to an NAND RS-latch circuit.

FIG. 16 is a circuit diagram showing a structure of a circuit 340, in which the invention is applied to the NAND RS latch circuit.

Referring to FIG. 16, circuit 340 includes a P-channel MOS transistor 344 which receives control signal ZSC on its gate, and has a source connected to a node supplied with power supply potential Vdd and a drain connected to a node N42, a P-channel MOS transistor 342 which has a gate connected to a node N52, a source connected to the node supplied with power supply potential Vdd and a drain connected to node N42, an N-channel MOS transistor 350 which receives control signal SC on its gate, and has a source connected to the node supplied with ground potential Vss and a drain connected to a node N44, an N-channel MOS transistor 348 which has a gate connected to node N52, a source connected to the node supplied with ground potential Vss and a drain connected to node N44, and an NAND circuit 346 which receives on its inputs a set signal Set and the potential on node N52, and issues an output signal Q onto a node N50. The power supply node of NAND circuit 346 is connected to node N42, and the ground node of NAND circuit 346 is connected to node N44.

Circuit 340 further includes a P-channel MOS transistor 354 which receives control signal ZSC on its gate, and has a source connected to the node supplied with power supply potential Vdd and a drain connected to a node N46, a P-channel MOS transistor 352 which has a gate connected to node N50, a source connected to the node supplied with power supply potential Vdd and a drain connected to node N46, an N-channel MOS transistor 360 which receives control signal SC on its gate, and has a source connected to the node supplied with ground potential Vss and a drain connected to a node N48, an N-channel MOS transistor 358 which has a gate connected to node N50, a source connected to the node supplied with ground potential Vss and a drain connected to node N48, and an NAND circuit 356 which receives on its inputs a reset signal Reset and the potential on node N50, and issues an output signal QC onto node N52. The power supply node of NAND circuit 356 is connected to node N46, and the ground node of NAND circuit 356 is connected to node N48.

NAND circuits 346 and 356 have structures similar to that of NAND circuit 216 already described with reference to FIG. 8, and therefore description will not be repeated.

Circuit 340 operates as follows.

FIG. 17 shows a relationship between input and output signals of circuit 340.

Referring to FIGS. 16 and 17, circuit 340 is in the operating state when control signals SC and ZSC are at H- and L-levels, respectively. In this state, P-channel MOS transistors 344 and 354 as well as N-channel MOS transistors 350 and 360 are all on so that the potentials on nodes N42 and N46 are equal to power supply potential Vdd, and the potentials on nodes N44 and N48 are equal to ground potential Vss. NAND circuits 346 and 356 operate as a fast latch circuit.

When set signal Set is at H-level and reset signal Reset is at H-level, output signals Q and QC hold the values which were previously set. When set signal Set is at L-level and reset signal Reset is at H-level, output signal Q is at H-level, and output signal QC is at the inverted level, i.e., at L-level. When set signal Set is at H-level and reset signal Reset is at L-level, output signal Q is at L-level, and output signal QC is at the inverted level, i.e., at H-level. When set signal Set is at L-level and reset signal Reset is at L-level, output signals Q and QC take on unstable values, and therefore this input condition is normally inhibited.

When control signal SC is at H-level and control signal ZSC is at L-level, circuit 340 is on standby, and serves as a hold circuit of which sub-threshold current is reduced.

More specifically, when set signal Set is at H-level and reset signal reset is at H-level, output signals Q and QC hold the values which were previously set. After the circuit enters the standby state, it is not necessary to give consideration to the change in input signals, and therefore other input conditions of set signal Set and reset signal Reset during standby are not important and thus are not described.

Under the above conditions, P-channel MOS transistors 344 and 354 as well as N-channel MOS transistors 350 and 360 are all off, and the sub-threshold current consumed in circuit 340 depends on the on states of P-channel MOS transistors 342 and 352 as well as N-channel MOS transistors 348 and 358.

More specifically, when the held value of output signal Q is at H-level, P-channel MOS transistor 352 is off, and N-channel MOS transistor 358 is on. Therefore, the sub-threshold current flowing through NAND circuit 356 takes on an extremely small value determined by P-channel MOS transistors 352 and 354 which are off and have the threshold voltages of large absolute values. In this state, output signal QC is at L-level, P-channel MOS transistor 342 is on, and N-channel MOS transistor 348 is off. Therefore, the sub-threshold current flowing through NAND circuit 346 takes on an extremely small value determined by N-channel MOS transistors 348 and 350 which are off and have the threshold voltages of large absolute values.

When the held value of output signal Q is at L-level, N-channel MOS transistor 358 is off, and P-channel MOS transistor 352 is on. Therefore, the sub-threshold current flowing through NAND circuit 356 takes on an extremely small value determined by N-channel MOS transistors 358 and 360 which are off and have the threshold voltages of large absolute values. In this state, output signal QC is at H-level, N-channel MOS transistor 348 is on and P-channel MOS transistor 342 is off. Therefore, the sub-threshold current flowing through NAND circuit 346 takes on an extremely small value determined by P-channel MOS transistors 342 and 344 which are off and have the threshold voltages of large absolute values.

In circuit 340, one P-channel MOS transistor 342 and one N-channel MOS transistor 348 are arranged on the power supply node side and the ground node side of NAND circuit 346 for controlling the standby current of NAND circuit 346, respectively, and one P-channel MOS transistor 352 and one N-channel MOS transistor 358 are arranged on the power supply node side and the ground node side of NAND circuit 356 for controlling the standby current of NAND circuit 356, respectively. Alternatively, a structure similar to that of the NAND circuit shown in FIG. 8 may be employed. In circuit 340, input values of set signal Set and reset signal Reset during standby are predetermined, and therefore circuit 340 is not provided with the transistors which can be removed in view of the above.

As described above, circuit 340 operates as a latch circuit capable of fast operation. Further, in either of the cases where the value set immediately before the standby is at H-level and is at L-level, circuit 340 can hold the value during standby while reducing the sub-threshold current.

[Embodiment 6]

A semiconductor device of an embodiment 6 differs from the embodiment 1 in that the invention is applied to an NOR RS latch circuit instead of the inverter.

Figure 18:
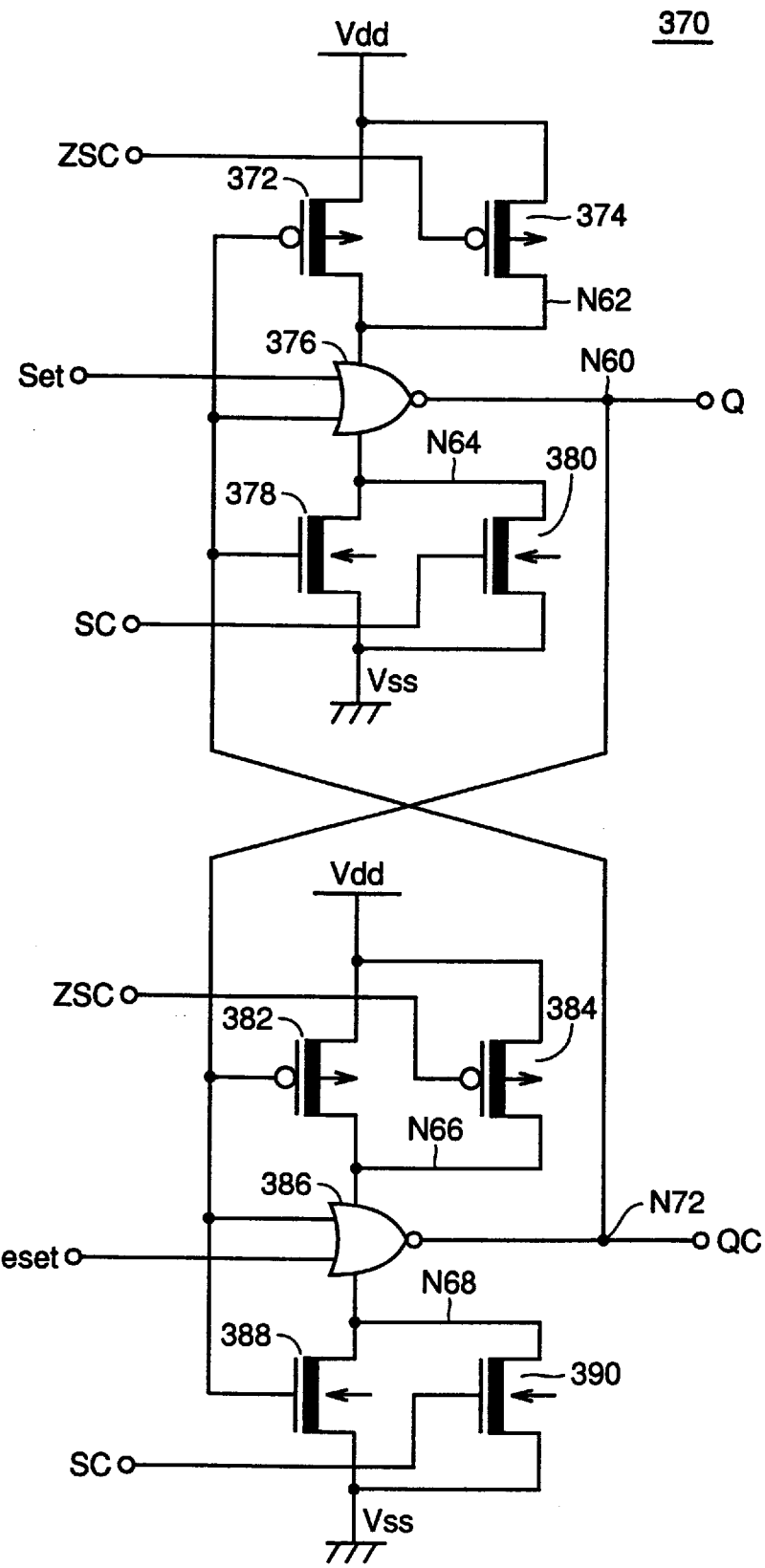
FIG. 18 is a circuit diagram showing a structure of a circuit 370, in which the invention is applied to an NOR latch circuit.
Figure 20:
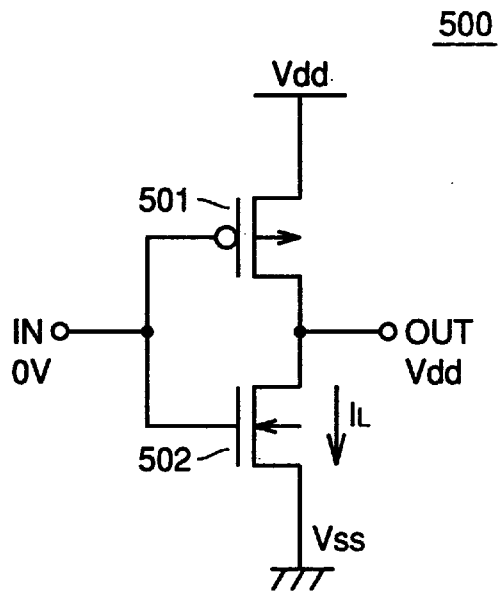
FIG. 20 is a circuit diagram showing a structure of an inverter 500 in a conventional semiconductor device.
Figure 21:
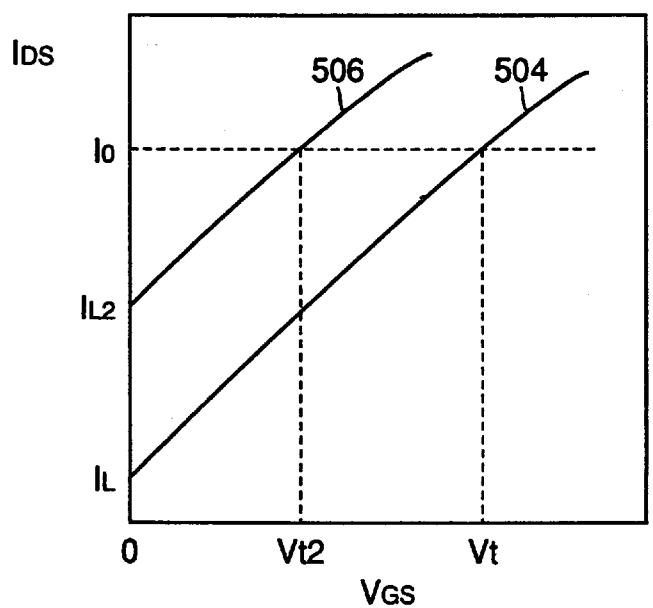
FIG. 21 shows a relationship between a gate-source voltage VGS and a drain current IDS of an N-channel MOS transistor.
Figure 22:
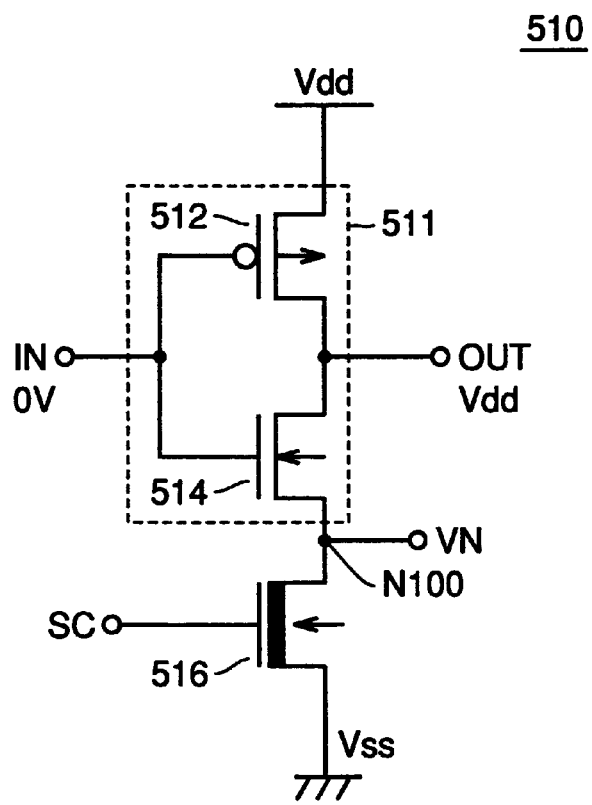
FIG. 22 is a circuit diagram showing an inverter 510 reducing a sub-threshold current by switching a source voltage, as is proposed in the prior art.
Figure 23A:
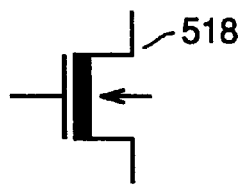
FIGS. 23A and 23B show types of transistors, and particularly show symbols of transistors of high and low threshold voltages, respectively.
Figure 23B:
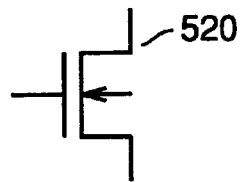
Figure 24:
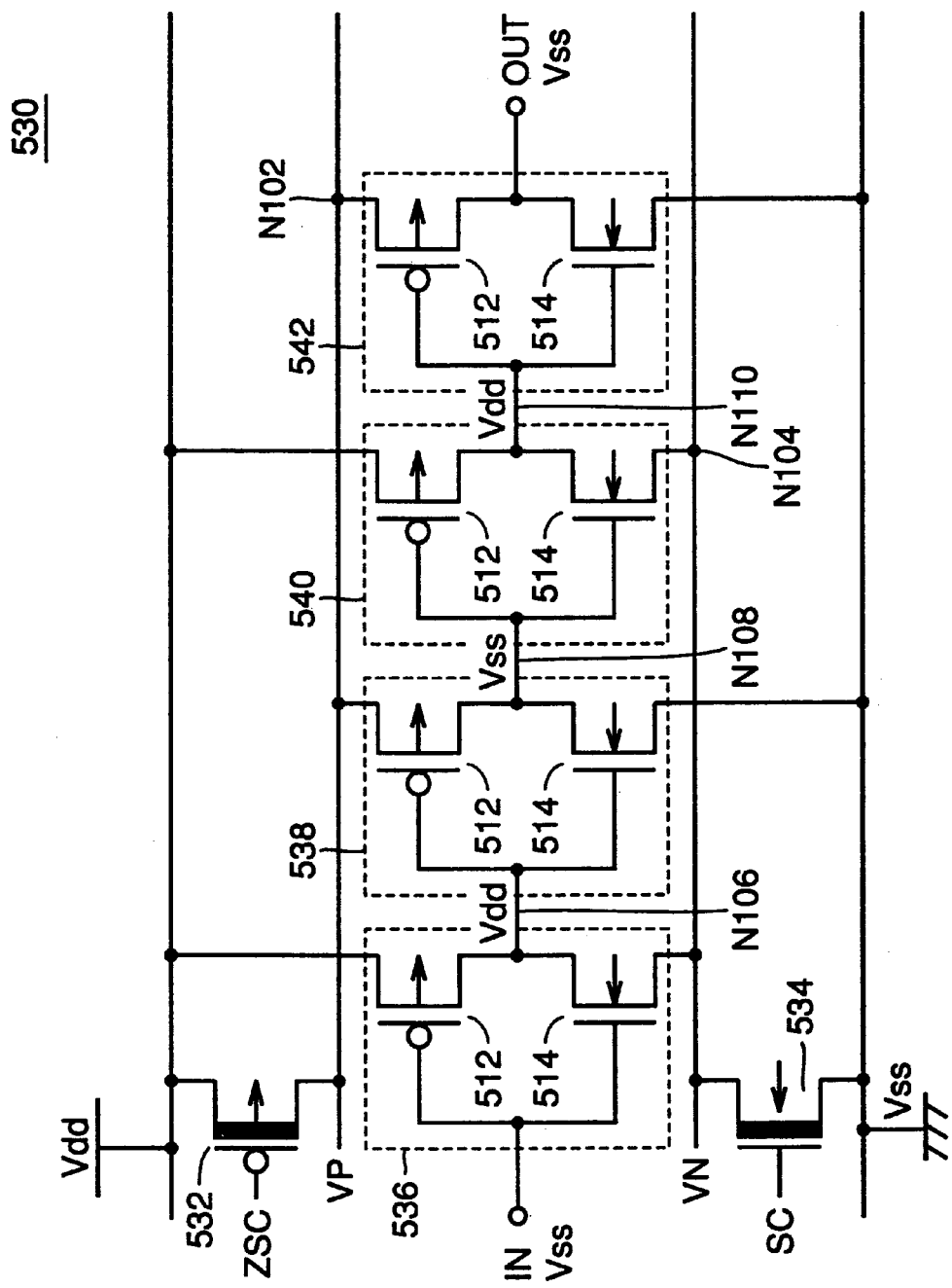
FIG. 24 is a circuit diagram of a circuit 530 employing a series connection of the inverters shown in FIG. 22.

FIG. 18 is a circuit diagram showing a structure of a circuit 370 to which the invention is applied to the NOR latch circuit.

Referring to FIG. 18, circuit 370 includes a P-channel MOS transistor 374 which receives control signal ZSC on its gate, and has a source connected to a node supplied with power supply potential Vdd and a drain connected to a node N62, a P-channel MOS transistor 372 which has a gate connected to a node N72, a source connected to the node supplied with power supply potential Vdd and a drain connected to node N62, an N-channel MOS transistor 380 which receives control signal SC on its gate, and has a source connected to the node supplied with ground potential Vss and a drain connected to a node N64, an N-channel MOS transistor 378 which has a gate connected to a node N72, a source connected to the node supplied with ground potential Vss and a drain connected to node N64, and an NOR circuit 376 which receives set signal Set and the potential on node N72 on its inputs, respectively, and issues output signal Q onto a node N60. NOR circuit 376 has a power supply node connected to node N62 and a ground node connected to node N64.

Circuit 370 further includes a P-channel MOS transistor 384 which receives control signal ZSC on its gate, and has a source connected to the node supplied with power supply potential Vdd and a drain connected to a node N66, a P-channel MOS transistor 382 which has a gate connected to node N60, a source connected to the node supplied with power supply potential Vdd and a drain connected to node N66, an N-channel MOS transistor 390 which receives control signal SC on its gate, and has a source connected to the node supplied with ground potential Vss and a drain connected to a node N68, an N-channel MOS transistor 388 which has a gate connected to node N60, a source connected to the node supplied with ground potential Vss and a drain connected to node N68, and an NAND circuit 386 which receives reset signal Reset and the potential on node N60 on its inputs, respectively, and issues output signal Q onto node N72. NAND circuit 386 has a power supply node connected to node N66 and a ground node connected to node N68.

NOR circuits 376 and 386 have structures similar to that of NOR circuit 250 already described with reference to FIG. 10, and therefore description will not be repeated.

Circuit 370 operates as follows.

FIG. 17 shows a relationship between input and output signals of circuit 370.

Referring to FIGS. 18 and 19, circuit 370 is in the operating state when control signals SC and ZSC are at H- and L-levels, respectively. In this state, P-channel MOS transistors 374 and 384 as well as N-channel MOS transistors 380 and 390 are all on so that the potentials on nodes N62 and N66 are equal to power supply potential Vdd, and the potentials on nodes N64 and N68 are equal to ground potential Vss. NOR circuits 376 and 386 operate as a fast latch circuit.

When set signal Set is at L-level and reset signal Reset is at L-level, output signals Q and QC hold the values which were previously set. When set signal Set is at H-level and reset signal Reset is at L-level, output signal Q is at L-level, and output signal QC is at the inverted level, i.e., at H-level. When set signal Set is at L-level and reset signal Reset is at H-level, output signal Q is at H-level, and output signal QC is at the inverted level, i.e., at L-level. When set signal Set is at H-level and reset signal Reset is at H-level, output signals Q and QC take on unstable values, and therefore this input condition is normally inhibited.

When control signal SC is at H-level and control signal ZSC is at L-level, circuit 370 is on standby, and serves as a hold circuit of which sub-threshold current is reduced.

More specifically, when set signal Set is at L-level and reset signal reset is at L-level, output signals Q and QC hold the values which were previously set. After the circuit enters the standby state, it is not necessary to give consideration to the change in input signals, and therefore other input conditions of set signal Set and reset signal Reset during standby are not important and thus are not described.

Under the above conditions, P-channel MOS transistors 374 and 384 as well as N-channel MOS transistors 380 and 390 are all off, and the sub-threshold current consumed in circuit 370 depends on the on states of P-channel MOS transistors 372 and 382 as well as N-channel MOS transistors 378 and 388.

More specifically, when the held value of output signal Q is at H-level, P-channel MOS transistor 382 is off, and N-channel MOS transistor 388 is on. Therefore, the sub-threshold current flowing through NOR circuit 386 takes on an extremely small value determined by P-channel MOS transistors 382 and 384 which are off and have the threshold voltages of large absolute values. In this state, output signal QC is at L-level, P-channel MOS transistor 372 is on, and N-channel MOS transistor 378 is off. Therefore, the sub-threshold current flowing through NOR circuit 376 takes on an extremely small value determined by N-channel MOS transistors 378 and 380 which are off and have the threshold voltages of large absolute values.

When the held value of output signal Q is at L-level, N-channel MOS transistor 388 is off, and P-channel MOS transistor 382 is on. Therefore, the sub-threshold current flowing through NOR circuit 386 takes on an extremely small value determined by N-channel MOS transistors 388 and 390 which are off and have the threshold voltages of large absolute values. In this state, output signal QC is at H-level, N-channel MOS transistor 378 is on and P-channel MOS transistor 372 is off. Therefore, the sub-threshold current flowing through NOR circuit 376 takes on an extremely small value determined by P-channel MOS transistors 372 and 374 which are off and have the threshold voltages of large absolute values.

In circuit 370, one P-channel MOS transistor 372 and one N-channel MOS transistor 378 are arranged on the power supply node side and the ground node side of NOR circuit 376 for controlling the standby current of NOR circuit 376, respectively, and one P-channel MOS transistor 382 and one N-channel MOS transistor 388 are arranged on the power supply node side and the ground node side of NOR circuit 386 for controlling the standby current of NOR circuit 386, respectively. Alternatively, a structure similar to that of the NOR circuit shown in FIG. 10 may be employed. In circuit 370, input values of set signal Set and reset signal Reset during standby are predetermined, and therefore circuit 370 is not provided with the transistors which can be removed in view of the above.

As described above, circuit 370 operates as a latch circuit capable of fast operation. Further, in either of the cases where the value set immediately before the standby is at H-level and is at L-level, circuit 370 can hold the value during standby while reducing the sub-threshold current.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a first power supply node for receiving a first power supply potential;
    a second power supply node for receiving a second power supply potential lower than said first power supply potential; and
    a first logic circuit coupled between said first and second power supply nodes, operating in an operation mode to receive at least one signal and issue a result of a predetermined first logical operation to a first output node, and operating in a standby mode to hold the result of said first logical operation existing at the time of transition from said operation mode to said standby mode,
    said first logic circuit including:
        a first logical operation unit arranged between first and second internal nodes, and issuing the result of said first logical operation in accordance with said signal,
        said first logical operation unit including:
            a first internal circuit coupled between said first internal node and said first output node for connecting said first internal node to said first output node in accordance with said signal, and
            a second internal circuit coupled between said second internal node and said first output node for connecting said second internal node to said first output node in accordance with said signal, said first logic circuit further including:
            a first connection circuit coupled between said first internal node and said first power supply node for connecting said first internal node to said first power supply node during said operation mode and when said first internal circuit connects said first internal node to said first output node, said first connection circuit receiving said signal and a first control signal activated in said operation mode, and
        a second connection circuit coupled between said second internal node and said second power supply node for connecting said second internal node to said second power supply node during said operation mode and when said second internal circuit connects said second internal node to said first output node, said second connection circuit receiving said signal and a second control signal formed of a complementary signal of said first control signal,
    wherein a value of a leak current of said first correction circuit in the disconnection state is smaller than a value of a leak current of said first internal circuit in the disconnected state, and
    a value of a leak current of said second connection circuit in the disconnected state is smaller than a value of a leak current of said second internal circuit in the disconnected state.

2. A semiconductor device according to claim 1, wherein said first internal circuit has a first P-channel MOS transistor arranged on at least one path between said first internal node and said first output node, and being turned on in accordance with said signal,
    said first connection circuit includes:
        a first main connection circuit arranged between said first power supply node and said first internal node for being on in said operation mode and being off in said standby mode in accordance with said first control signal; and
        a first sub-connection circuit for connecting said first internal node to said first power supply node when said first internal circuit connects said first internal node to said first output node,
        said first sub-connection circuit has a second P-channel MOS transistor arranged on at least one path between said first internal node and said first power supply node, and has a threshold voltage larger in absolute value than that of said first P-channel MOS transistor, and
    said second internal circuit has a first N-channel MOS transistor arranged on at least one path between said second internal node and said first output node, and being turned on in accordance with said signal, said second connection circuit includes:
a second main connection circuit arranged between said second power supply node and said second internal node for being on in said operation mode and being off in said standby mode in accordance with said second control; and
a second sub-connection circuit for connecting said second internal node to said second power supply node when said second internal circuit connects said second internal node to said first output node, and
said second sub-connection circuit has a second N-channel MOS transistor arranged on at least one path between said second internal node and said second power supply node, and has a threshold voltage larger than absolute value than that of said first N-channel MOS transistor.

3. The semiconductor device according to claim 2, wherein
said first logical operation unit is a logical inverter supplied with power through said first and second internal nodes for inverting and issuing said signal to said first output node.

4. The semiconductor device according to claim 3, wherein
said first P-channel MOS transistor receives on its gate said signal, and has a drain and a source connected to said first output node and said first internal node, respectively,
said second P-channel MOS transistor receives on its gate said signal, and has a drain and a source connected to said first internal node and said first power supply node, respectively,
said first N-channel MOS transistor receives on its gate said signal, and has a drain and a source connected to said first output node and said second internal node, respectively, and
said second N-channel MOS transistor receives on its gate said signal, and has a drain and a source connected to said second internal node and said second power supply node, respectively.

5. The semiconductor device according to claim 2, wherein
said first logic circuit receives at least first and second input signals and issues the result of said first logical operation to said first output node in said operation mode, and
said first logical operation unit is an NAND circuit supplied with power through said first and second internal nodes, and issuing an NAND between said signals to said first output node.

6. The semiconductor device according to claim 5, wherein
said first internal circuit further includes a third P-channel MOS transistor having a threshold voltage equal to that of said first P-channel MOS transistor,
said first and third P-channel MOS transistors are arranged in parallel between said first output node and said first internal node, and receive on their gates said first and second input signals, respectively,
said second internal circuit further includes a third N-channel MOS transistor having a threshold voltage equal to that of said first N-channel MOS transistor, and
said first and third N-channel MOS transistors are arranged in series on a path between said first output node and said second internal node, and receive on their gates said first and second input signals, respectively.

7. The semiconductor device according to claim 2, wherein
said first logic circuit receives at least first and second input signals and issues the result of said first logical operation to said first output node in said operation mode, and
said first logical operation unit is an NOR circuit supplied with power through said first and second internal nodes, and issuing an NOR between said signals to said first output node.

8. The semiconductor device according to claim 7, wherein
said first internal circuit further includes a third P-channel MOS transistor having a threshold voltage equal to that of said first P-channel MOS transistor,
said first and third P-channel MOS transistors are arranged in series on a path between said first output node and said first internal node, and receive on their gates said first and second input signals, respectively,
said second internal circuit further includes a third N-channel MOS transistor having a threshold voltage equal to that of said first N-channel MOS transistor, and
said first and third N-channel MOS transistors are arranged in parallel between said first output node and said second internal node, and receive on their gates said first and second input signals, respectively.

9. The semiconductor device according to claim 2, wherein
said first logic circuit receives said signal and a first clock signal, and issues the result of said first logical operation to said first output node in said operation mode, and
said first logical operation unit is a clocked inverter supplied with power through said first and second internal nodes, and being activated in accordance with said first clock signal to invert and issue said signal to said first output node.

10. The semiconductor device according to claim 9, wherein
said first logic circuit further receives a second clock signal formed of a complementary signal of said first clock signal, and issues the result of said first logical operation to said first output node in said operation mode,
said first internal circuit further includes a third P-channel MOS transistor having a threshold voltage equal to that of said first P-channel MOS transistor,
said first and third P-channel MOS transistors are arranged in series on a path between said first output node and said first internal node, and receive on their gates said signal and said first clock signal, respectively,
said second internal circuit further includes a third N-channel MOS transistor having a threshold voltage equal to that of said first N-channel MOS transistor, and
said first and third N-channel MOS transistors are arranged in series on a path between said first output node and said second internal node, and receive on their gates said signal and said second clock signal, respectively.

11. The semiconductor device according to claim 1, further comprising:
a second logic circuit connected to said first and second power supply nodes, and issuing, in said standby mode, a result of a predetermined second logical operation, as said signal, to said first logic circuit in accordance with the output signal issued from said first logic circuit at the time of transition from said operation mode to said standby mode;

said second logic circuit including a second logical operation unit arranged between third and fourth internal nodes for issuing the result of said second logical operation to a second output node;

said second logical operation unit including:

a third internal circuit arranged between said third internal node and said second output node, and connecting said third internal node to said second output node in accordance with the output signal of said first logic circuit, and a fourth internal circuit arranged between said fourth internal node and said second output node, and connecting said fourth internal node to said second output node in accordance with the output signal of said first logic circuit;

said second logic circuit further including:

a third connection circuit for connecting said third internal node to said first power supply node during said operation mode and when said third internal circuit connects said third internal node to said second output node, and a fourth connection circuit for connecting said fourth internal node to said second power supply node during said operation mode and when said fourth internal circuit connects said fourth internal node to said second output node;

a value of a leak current of said third connection circuit in the disconnected state being smaller than a value of a leak current of said third internal circuit in the disconnected state; and a value of a leak current of said fourth connection circuit in the disconnected state being smaller than a value of a leak current of said fourth internal circuit in the disconnected state.

12. The semiconductor device according to claim 11, wherein said third internal circuit has a fourth P-channel MOS transistor arranged on at least one path between said third internal node and said second output node;

said third connection circuit includes:

a third main connection circuit arranged between said first power supply node and said third internal node for being on in said operation mode and being off in said standby mode, and a third sub-connection circuit for connecting said third internal node to said first power supply node when said third internal circuit connects said third internal node to said second output node;

said third sub-connection circuit has a fifth P-channel MOS transistor arranged on at least one path between said third internal node and said first power supply node, and has a threshold voltage larger in absolute value than that of said fourth P-channel MOS transistor;

said fourth internal circuit has a fourth N-channel MOS transistor arranged on at least one path between said fourth internal node and said second output node;

said fourth connection circuit includes:

a fourth main connection circuit arranged between said second power supply node and said fourth internal node for being on in said operation mode and being off in said standby mode, and a fourth sub-connection circuit for connecting said fourth internal node to said second power supply node when said fourth internal circuit connects said fourth internal node to said second output node; and said fourth sub-connection circuit has a fifth N-channel MOS transistor arranged on at least one path between said fourth internal node and said second power supply node, and has a threshold voltage larger in absolute value than that of said fourth N-channel MOS transistor.

13. The semiconductor device according to claim 12, wherein said first logic circuit receives a first input signal and a first internal signal and issues the result of said first logical operation to said first output node in said operation mode, said first logical operation unit is an NAND circuit supplied with a power through said first and second internal nodes, and issuing an NAND between said first input signal and said first internal signal, and said second logical operation unit is an NAND circuit supplied with a power through said third and fourth internal nodes, and issuing said first internal signal in accordance with an NAND between the output signal of said first logical operation unit and said second input signal.

14. The semiconductor device according to claim 12, wherein said first logic circuit receives a first input signal and a first internal signal and issues the result of said first logical operation to said first output node in said operation mode, said first logical operation unit is an NOR circuit supplied with a power through said first and second internal nodes, and issuing an NOR between said first input signal and said first internal signal, and said second logical operation unit is an NOR circuit supplied with a power through said third and fourth internal nodes, and issuing said first internal signal in accordance with an NOR between the output signal of said first logical operation unit and said second input signal.

15. The semiconductor device according to claim 1, wherein said first internal circuit has a first P-channel MOS transistor arranged on at least one path between said first internal node and said first output node, and being turned on in accordance with said signal, said second internal circuit has a first N-channel MOS transistor arranged on at least one path between said second internal node and said first output node, and being turned on in accordance with said signal, said first connection circuit has a sixth P-channel MOS transistor arranged between said first internal node and said first power supply node, and has a threshold voltage larger in absolute value than that of said first P-channel MOS transistor, and said second connection circuit has a sixth N-channel MOS transistor arranged between said second internal node and said second power supply node, and has a threshold voltage larger in absolute value than that of said first N-channel MOS transistor.

* * * * *

UNITED STATES PATENT AND TRADEMARK OFFICE
CERTIFICATE OF CORRECTION

PATENT NO.   : 6,288,573 B1
DATED        : September 11, 2001
INVENTOR(S)  : Hiroaki Tanizaki et al.

It is certified that error appears in the above-identified patent and that said Letters Patent is hereby corrected as shown below:

Title page,
Item [57], change "15 claims" to -- 17 claims --

Column 26,
Line 66, please add claims 16 and 17 as follows:
-- 16.   A semiconductor device comprising:
    a first power supply node for receiving a first power supply potential;
    a second power supply node for receiving a second power supply potential lower than said first power supply potential; and
    a first circuit coupled between said first and second power supply nodes, receiving at least one signal and issuing a result of a predetermined first logical operation to a first output node,
    said first logic circuit including a first logical operation unit coupled between first and second internal nodes, and issuing the result of said first logical operation in accordance with said signal,
    said first operation unit including
        a first internal circuit coupled between said first internal node and said first output node for connecting said first internal node to said first output node in accordance with said signal, and
        a second internal circuit coupled between said second internal node and said first output node for connecting said second internal node to said first output node in accordance with said signal,
    said first logic circuit further including
        a first connection circuit coupled between said first internal node and said first power supply node, receiving said signal and a first control signal, and connecting said first internal node to said first power supply node when said first control signal is active, and when said first internal circuit connects said first internal node to said first output node, and
        a second connection circuit coupled between said second internal node and said second power supply node, receiving said signal and a second control signal  formed of a complementary signal of said first control signal and connecting said second internal node to said second power supply node when said first control signal is active, and when said second internal circuit connects said second internal node to said first output node, wherein

UNITED STATES PATENT AND TRADEMARK OFFICE
CERTIFICATE OF CORRECTION

PATENT NO. : 6,288,573 B1
DATED : September 11, 2001
INVENTOR(S) : Hiroaki Tanizaki et al.

It is certified that error appears in the above-identified patent and that said Letters Patent is hereby corrected as shown below:

a value pack of a leak current of said second connection circuit in the disconnected state is smaller than a value of a leak current of said first internal circuit in the disconnected state, and
a value of a leak current of said second connection circuit in the disconnected state is smaller than a value of a leak current of said second internal circuit in the disconnected state.
17. The semiconductor device according to claim 1, further comprising
a memory cell array holding a storage data according to a memory control signal and an address signal, wherein said first logic circuit outputs a timing signal to said memory cell array according to said memory control signal. --

Signed and Sealed this

Eighteenth Day of June, 2002

*Attest:*

JAMES E. ROGAN
*Attesting Officer*            *Director of the United States Patent and Trademark Office*

UNITED STATES PATENT AND TRADEMARK OFFICE
CERTIFICATE OF CORRECTION

| | | |
|---|---|---|
| PATENT NO. | : 6,288,573 B1 | Page 1 of 2 |
| DATED | : September 11, 2001 | |
| INVENTOR(S) | : Hiroaki Tanizaki et al. | |

It is certified that error appears in the above-identified patent and that said Letters Patent is hereby corrected as shown below:

<u>Title page,</u>
Item [57], change "15 claims" to -- 17 claims --

<u>Column 26,</u>
Line 66, please add claims 16 and 17 as follows:
-- 16. A semiconductor device comprising:
    a first power supply node for receiving a first power supply potential;
    a second power supply node for receiving a second power supply potential lower than said first power supply potential; and
    a first circuit coupled between said first and second power supply nodes, receiving at least one signal and issuing a result of a predetermined first logical operation to a first output node,
    said first logic circuit including a first logical operation unit coupled between first and second internal nodes, and issuing the result of said first logical operation in accordance with said signal,
    said first operation unit including
        a first internal circuit coupled between said first internal node and said first output node for connecting said first internal node to said first output node in accordance with said signal, and
        a second internal circuit coupled between said second internal node and said first output node for connecting said second internal node to said first output node in accordance with said signal,
    said first logic circuit further including
        a first connection circuit coupled between said first internal node and said first power supply node, receiving said signal and a first control signal, and connecting said first internal node to said first power supply node when said first control signal is active, and when said first internal circuit connects said first internal node to said first output node, and
        a second connection circuit coupled between said second internal node and said second power supply node, receiving said signal and a second control signal formed of a complementary signal of said first control signal and connecting said second internal node to said second power supply node when said first control signal is active, and when said second internal circuit connects said second internal node to said first output node, wherein

UNITED STATES PATENT AND TRADEMARK OFFICE
CERTIFICATE OF CORRECTION

PATENT NO.    : 6,288,573 B1
DATED         : September 11, 2001
INVENTOR(S)   : Hiroaki Tanizaki et al.

It is certified that error appears in the above-identified patent and that said Letters Patent is hereby corrected as shown below:

a value of a leak current of said first connection circuit in the disconnected state is smaller than a value of a leak current of said first internal circuit in the disconnected state, and
   a value of a leak current of said second connection circuit in the disconnected state is smaller than a value of a leak current of said second internal circuit in the disconnected state.
  17. The semiconductor device according to claim 1, further comprising a memory cell array holding a storage data according to a memory control signal and an address signal, wherein said first logic circuit outputs a timing signal to said memory cell array according to said memory control signal. --

This certificate supersedes Certificate of Correction issued June 18, 2002.

Signed and Sealed this

Twentieth Day of August, 2002

*Attest:*

JAMES E. ROGAN
*Director of the United States Patent and Trademark Office*

*Attesting Officer*